(12) United States Patent
Shen

(10) Patent No.: US 6,704,609 B1
(45) Date of Patent: Mar. 9, 2004

(54) MULTI-CHIP SEMICONDUCTOR MODULE AND MANUFACTURING PROCESS THEREOF

(75) Inventor: Ming-Tung Shen, 4F, No. 52, Sec. 2, Chung-Shan N. Rd., Taipei City (TW)

(73) Assignee: Ming-Tung Shen, Taipei (TW)

( * ) Notice: Subject to any disclaimer, the term of this patent is extended or adjusted under 35 U.S.C. 154(b) by 736 days.

(21) Appl. No.: 09/618,501

(22) Filed: Jul. 18, 2000

(30) Foreign Application Priority Data

Sep. 8, 1999 (TW) ...................................... 88115461 A
Sep. 8, 1999 (TW) ...................................... 88215325 U

(51) Int. Cl.[7] .............................................. G06F 19/00
(52) U.S. Cl. .............................. 700/121; 716/4; 716/8; 716/17; 703/1
(58) Field of Search ............................ 700/121; 703/1; 716/4, 8, 17; 438/106, 108, 109, 113, 127, 123, 10, 15, 455, 612, 660, 17, 110, 112, 118, 115, 126

(56) References Cited

U.S. PATENT DOCUMENTS

| | | | | |
|---|---|---|---|---|
| 5,583,378 A | * | 12/1996 | Marrs et al. | 257/710 |
| 5,646,828 A | * | 7/1997 | Degani et al. | 361/715 |
| 6,104,091 A | * | 8/2000 | Ito et al. | 257/738 |
| 6,118,178 A | * | 9/2000 | Takeuchi | 257/707 |
| 6,368,894 B1 | * | 4/2002 | Shen | 438/106 |
| 6,473,665 B2 | * | 10/2002 | Mugibayashi et al. | 700/110 |

* cited by examiner

Primary Examiner—Leo Picard
Assistant Examiner—Chad Rapp
(74) Attorney, Agent, or Firm—Merchant & Gould, P.C.

(57) ABSTRACT

A multi-chip semiconductor module includes first and second substrates. The first substrate has opposite first and second surfaces, a plurality of first conductive vias that extend through the first and second surfaces, and a first circuit layout patterned on the second surface and connected electrically to the first conductive vias. The second substrate has opposite first and second surfaces, a plurality of second conductive vias that extend through the first and second surfaces of the second substrate, a second circuit layout patterned on the second surface of the second substrate and connected electrically to the second conductive vias, and a chip-receiving opening formed therein. The first surface of the second substrate is bonded on the second surface of the first substrate such that the second circuit layout is connected electrically to the first circuit layout through the first and second conductive vias. A first semiconductor chip is disposed in the chip-receiving openings, and has a first contact pad surface mounted on the second surface of the first substrate and formed with a plurality of first contact pads that are connected to the first circuit layout. A second semiconductor chip has a second contact pad surface mounted on the second surface of the second substrate and formed with a plurality of second contact pads that are connected to the second circuit layout.

65 Claims, 25 Drawing Sheets

MULTI-CHIP SEMICONDUCTOR MODULE AND MANUFACTURING PROCESS THEREOF

BACKGROUND OF THE INVENTION

1. Field of the Invention

The present invention relates to a multi-chip semiconductor module and a manufacturing process thereof. More particularly, the present invention relates to a multi-chip semiconductor module manufacturing process for increasing the yield of the multi-chip semiconductor module, and a multi-chip semiconductor module that incorporates different functional chips.

2. Description of the Prior Art

Portability is a main development trend in the semiconductor industry. In order to reduce the overall size and weight of an electronic product, the size of a printed circuit board has to be reduced first. It has been proposed to combine semiconductor chips with different functions into a single semiconductor module, that is, the multi-chip semiconductor module.

However, poor yield of the multi-chip semiconductor module has always been a problem during mass production. When one of the semiconductor chips in the module is defective, the whole module will be affected. Moreover, detection of the defective chips is very time consuming and costly.

Accordingly, the present invention is directed to a multi-chip semiconductor module manufacturing process for increasing the yield of the multi-chip semiconductor module, and a multi-chip semiconductor module that incorporates semiconductor chips with different functions

SUMMARY OF THE INVENTION

According to one aspect of the present invention, a process of manufacturing a multi-chip semiconductor module comprises the steps of: (a) providing a chip-mounting member including first and second substrates, the first substrate having opposite first and second surfaces, a plurality of first conductive vias that extend through the first and second surfaces, a first circuit layout patterned on the second surface and connected electrically to the first conductive vias, and a plurality of first testing points disposed on the second surface and connected electrically to the first circuit layout, the second substrate having opposite first and second surfaces, a plurality of second conductive vias that extend through the first and second surfaces of the second substrate, a second circuit layout patterned on the second surface of the second substrate and connected electrically to the second conductive vias, a plurality of second testing points disposed on the second surface of the second substrate and connected electrically to the second circuit layout, and a first chip-receiving opening formed therein; (b) mounting a first contact pad surface of a first semiconductor chip on the second surface of the first substrate, and connecting electrically a plurality of first contact pads on the first contact pad surface to the first circuit layout; (c) testing the first semiconductor chip through the first testing points of the first substrate so that replacement of the first semiconductor chip can be conducted if the first semiconductor chip is found to be defective; (d) bonding the first surface of the second substrate on the second surface of the first substrate such that the first semiconductor chip is disposed in the first chip-receiving opening and such that the second circuit layout is connected electrically to the first circuit layout through the first and second conductive vias; (e) mounting a second contact pad surface of a second semiconductor chip on the second surface of the second substrate, and connecting electrically a plurality of second contact pads on the second contact pad surface to the second circuit layout; and (f) testing the second semiconductor chip through the second testing points of the second substrate so that replacement of the second semiconductor chip can be conducted if the second semiconductor chip is found to be defective.

According to another aspect of the present invention, a process of manufacturing a multi-chip semiconductor module comprises the steps of: (a) providing a chip-mounting member including first and second substrates, the first substrate having opposite first and second surfaces, a plurality of first conductive vias that extend through the first and second surfaces, a first circuit layout patterned on the second surface and connected electrically to the first conductive vias, and a plurality of first testing points disposed on the second surface and connected electrically to the first circuit layout, the second substrate having opposite first and second surfaces, a plurality of second conductive vias that extend through the first and second surfaces of the second substrate, a second circuit layout patterned on the second surface of the second substrate and connected electrically to the second conductive vias, a plurality of second testing points disposed on the second surface of the second substrate and connected electrically to the second circuit layout, and a first chip-receiving opening formed therein; the first surface of the second substrate being bonded on the second surface of the first substrate such that the second circuit layout is connected electrically to the first circuit layout through the first and second conductive vias, and such that the second substrate does not cover the first testing points; (b) disposing a first semiconductor chip in the first chip-receiving opening, mounting a first contact pad surface of the first semiconductor chip on the second surface of the first substrate, and connecting electrically a plurality of first contact pads on the first contact pad surface to the first circuit layout; (c) testing the first semiconductor chip through the first testing points of the first substrate so that replacement of the first semiconductor chip can be conducted if the first semiconductor chip is found to be defective; (d) mounting a second contact pad surface of a second semiconductor chip on the second surface of the second substrate, and connecting electrically a plurality of second contact pads on the second contact pad surface to the second circuit layout; and (e) testing the second semiconductor chip through the second testing points of the second substrate so that replacement of the second semiconductor chip can be conducted if the second semiconductor chip is found to be defective.

According to still another aspect of the present invention, a multi-chip semiconductor module comprises: a chip-mounting member including first and second substrates, the first substrate having opposite first and second surfaces, a plurality of first conductive vias that extend through the first and second surfaces, and a first circuit layout patterned on the second surface and connected electrically to the first conductive vias, the second substrate having opposite first and second surfaces, a plurality of second conductive vias that extend through the first and second surfaces of the second substrate, a second circuit layout patterned on the second surface of the second substrate and connected electrically to the second conductive vias, and a first chip-receiving opening formed therein, the first surface of the second substrate being bonded on the second surface of the first substrate such that the second circuit layout is connected electrically to the first circuit layout through the first and second conductive vias; a first semiconductor chip disposed in the first chip-receiving opening and having a first contact pad surface mounted on the second surface of the first substrate, the first contact pad surface being formed with a plurality of first contact pads; first conductor means for connecting electrically the first contact pads to the first circuit layout; a second semiconductor chip having a second contact pad surface mounted on the second surface of the second substrate, the second contact pad surface being formed with a plurality of second contact pads; and second conductor means for connecting electrically the second contact pads to the second circuit layout.

According to a further aspect of the present invention, a process of manufacturing a multi-chip semiconductor module comprises the steps of: (a) providing a chip-mounting member including first, second and third substrates, the first substrate having opposite first and second surfaces, and a plurality of first conductive vias that extend through the first and second surfaces, the second substrate having opposite first and second surfaces, a plurality of second conductive vias that extend through the first and second surfaces of the second substrate, a first circuit layout patterned on the second surface of the second substrate and connected electrically to the second conductive vias, a plurality of first testing points disposed on the second surface of the second substrate and connected electrically to the first circuit layout, and a first chip-receiving opening formed therein, the third substrate having opposite first and second surfaces, a plurality of third conductive vias that extend through the first and second surfaces of the third substrate, a second circuit layout patterned on the second surface of the third substrate and connected electrically to the third conductive vias, a plurality of second testing points disposed on the second surface of the third substrate and connected electrically to the second circuit layout, and a second chip-receiving opening larger than the first chip-receiving opening formed therein; (b) bonding the first surface of the second substrate on the second surface of the first substrate such that the first circuit layout is connected electrically to the first conductive vias through the second conductive vias; (c) disposing a first semiconductor chip in the first chip-receiving opening, mounting the first semiconductor chip on the second surface of the first substrate, and wire-bonding a plurality of first contact pads on one side of the first semiconductor chip to the first circuit layout; (d) testing the first semiconductor chip through the first testing points so that replacement of the first semiconductor chip can be conducted if the first semiconductor chip is found to be defective; (e) bonding the first surface of the third substrate on the second surface of the second substrate such that the second circuit layout is connected electrically to the first circuit layout through the second and third conductive vias, and such that the first and second chip-receiving openings are disposed on a common vertical axis; (f) disposing a second semiconductor chip in the second chip-receiving opening, mounting the second semiconductor chip on said one side of the first semiconductor chip through a first adhesive layer such that the second semiconductor chip is spaced apart from the second surface of the second substrate along the vertical axis, and wire-bonding a plurality of second contact pads on one side of the second semiconductor chip to the second circuit layout; and (g) testing the second semiconductor chip through the second testing points so that replacement of the second semiconductor chip can be conducted if the second semiconductor chip is found to be defective.

According to still a further aspect of the present invention, a process of manufacturing a multi-chip semiconductor module comprises the steps of: (a) providing a chip-mounting member including first, second and third substrates, the first substrate having opposite first and second surfaces, and a plurality of first conductive vias that extend through the first and second surfaces, the second substrate having opposite first and second surfaces, a plurality of second conductive vias that extend through the first and second surfaces of the second substrate, a first circuit layout patterned on the second surface of the second substrate and connected electrically to the second conductive vias, a plurality of first testing points disposed on the second surface of the second substrate and connected electrically to the first circuit layout, and a first chip-receiving opening formed therein, the first surface of the second substrate being bonded on the second surface of the first substrate such that the first circuit layout is connected electrically to the first conductive vias through the second conductive vias, the third substrate having opposite first and second surfaces, a plurality of third conductive vias that extend through the first and second surfaces of the third substrate, a second circuit layout patterned on the second surface of the third substrate and connected electrically to the third conductive vias, a plurality of second testing points disposed on the second surface of the third substrate and connected electrically to the second circuit layout, and a second chip-receiving opening larger than the first chip-receiving opening formed therein, the first surface of the third substrate being bonded on the second surface of the second substrate such that the second circuit layout is connected electrically to the first circuit layout through the second and third conductive vias, such that the first and second chip-receiving openings are disposed on a common vertical axis, and such that the third substrate does not cover the first testing points, (b) disposing a first semiconductor chip in the first chip-receiving opening, mounting the first semiconductor chip on the second surface of the first substrate, and wire-bonding a plurality of first contact pads on one side of the first semiconductor chip to the first circuit layout; (c) testing the first semiconductor chip through the first testing points so that replacement of the first semiconductor chip can be conducted if the first semiconductor chip is found to be defective; (d) disposing a second semiconductor chip in the second chip-receiving opening, mounting the second semiconductor chip on said one side of the first semiconductor chip through a first adhesive layer such that the second semiconductor chip is spaced apart from the second surface of the second substrate along the vertical axis, and wire-bonding a plurality of second contact pads on one side of the second semiconductor chip to the second circuit layout; and (e) testing the second semiconductor chip through the second testing points so that replacement of the second semiconductor chip can be conducted if the second semiconductor chip is found to be defective.

According to yet another aspect of the present invention, a multi-chip semiconductor module comprises: a chip-mounting member including first, second and third substrates, the first substrate having opposite first and second surfaces, and a plurality of first conductive vias that extend through the first and second surfaces, the second substrate having opposite first and second surfaces, a plurality of second conductive vias that extend through the first and second surfaces of the second substrate, a first circuit layout patterned on the second surface of the second substrate and connected electrically to the second conductive vias, and a first chip-receiving opening formed therein, the first surface of the second substrate being bonded on the second surface of the first substrate such that the first circuit layout is connected electrically to the first conductive vias through the second conductive vias, the third substrate having opposite first and second surfaces, a plurality of third conductive vias that extend through the first and second surfaces of the third substrate, a second circuit layout patterned on the second surface of the third substrate and connected electrically to the third conductive vias, and a second chip-receiving opening larger than the first chip-receiving opening formed therein, the first surface of the third substrate being bonded on the second surface of the second substrate such that the second circuit layout is connected electrically to the first circuit layout through the second and third conductive vias, and such that the first and second chip-receiving openings are disposed on a common vertical axis; a first semiconductor chip having one side provided with a plurality of first contact pads, the first semiconductor chip being disposed in the first chip-receiving opening and being mounted on the second surface of the first substrate, the first contact pads being wire-bonded to the first circuit layout; a second semiconductor chip having one side provided with a plurality of second contact pads, the second semiconductor chip being disposed in the second chip-receiving opening, the second contact pads being wire-bonded to the second circuit layout; and an adhesive layer for mounting the second semiconductor chip on said one side of the first semiconductor chip such that the second semiconductor chip is spaced apart from the second surface of the second substrate along the vertical axis.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the present invention, and are incorporated in and constitute a part of this specification. The drawings illustrate preferred embodiments of the present invention and, together with the description, serve to explain the principles of the present invention. In the drawings.

DESCRIPTION OF THE PREFERRED EMBODIMENTS

The process of manufacturing a multi-chip semiconductor module and the structure thereof described below do not form a complete process for manufacturing the same. The present invention can be practiced in conjunction with the process currently used in the art, and only so much of the commonly practiced process steps are included as are necessary for understanding the present invention. Furthermore, in the manufacturing of the multi-chip semiconductor module in accordance with the present invention, the number of chips assembled can be modified as desired. For simplifying the illustration of the embodiments of the present invention, only up to five chips are used in the multi-chip semiconductor module of the present invention. Furthermore, the same element is denoted by the same number throughout the specification.

Figure 1:
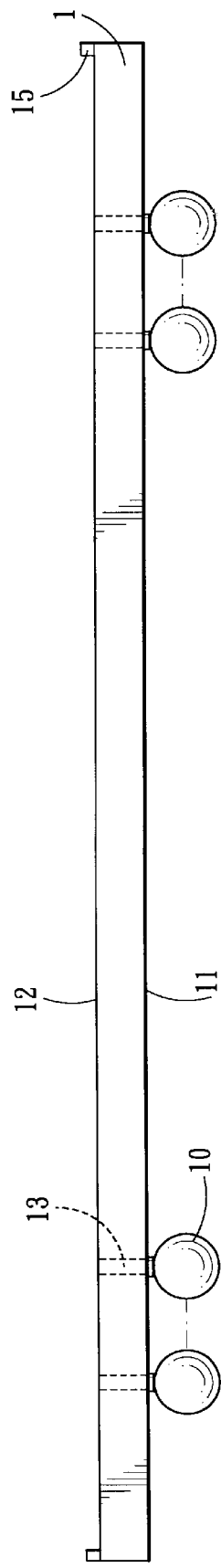
FIGS. 1 to 7 are schematic partly cross-sectional views showing a manufacturing process for a multi-chip semiconductor module in accordance with a first preferred embodiment of the present invention.
Figure 9:
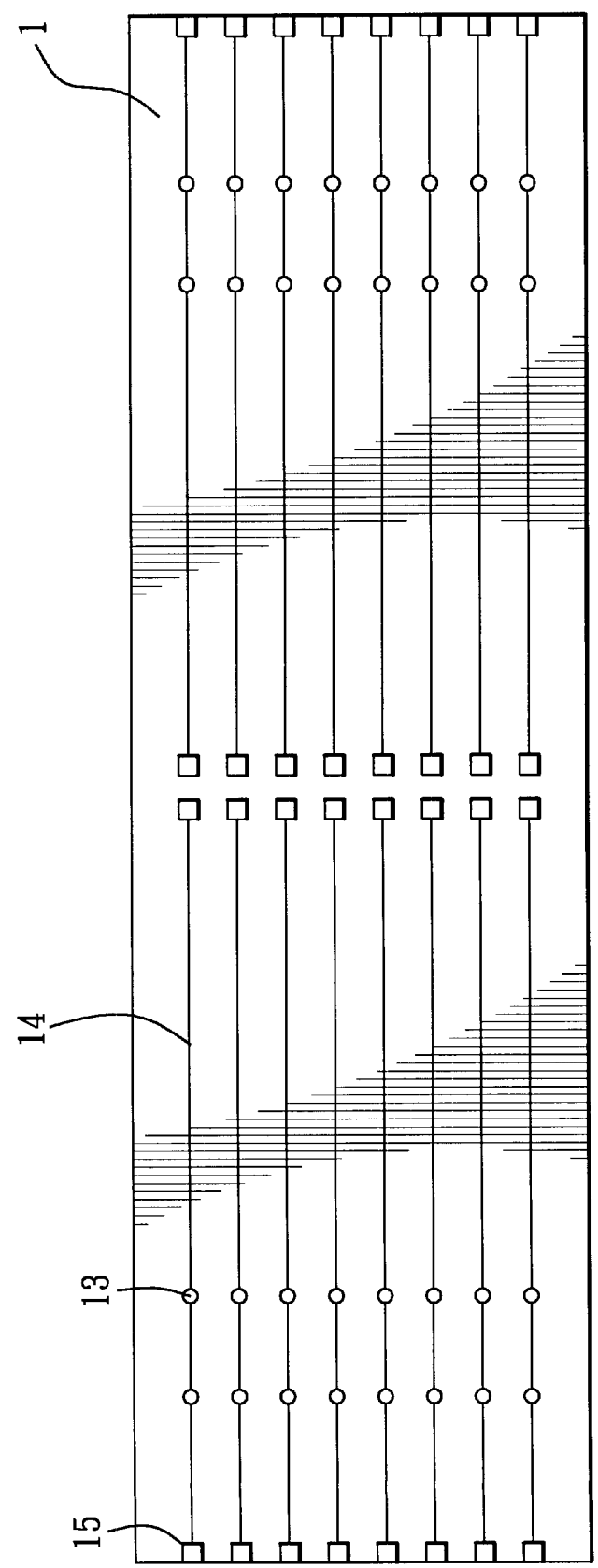
FIG. 9 is a schematic plan view showing a preferred embodiment of a layout of conductive traces on a substrate in accordance with the present invention.

FIGS. 1 to 7 are schematic partly cross-sectional views showing a manufacturing process for a multi-chip semiconductor module in accordance with a first preferred embodiment of the present invention. As shown in FIG. 1, a first substrate 1 can be a printed circuit board, a metal plate covered with an insulating material, or a ceramic board. The first substrate 1 has opposite first and second surfaces 11, 12, a plurality of first conductive vias 13 that extend through the first and second surfaces 11, 12, a first circuit layout which is formed from a plurality of electrical traces 14 (see FIG. 9) and which is patterned on the second surface 12 and connected electrically to the first conductive vias 13, and a plurality of first testing points 15 disposed on the second surface 12 and connected electrically to the first circuit layout 14. A plurality of solder balls 10 are mounted on the first surface 11 of the first substrate 1 at positions corresponding to the first conductive vias 13 such that the solder balls 10 are connected electrically and respectively to the first conductive vias 13.

Figure 2:
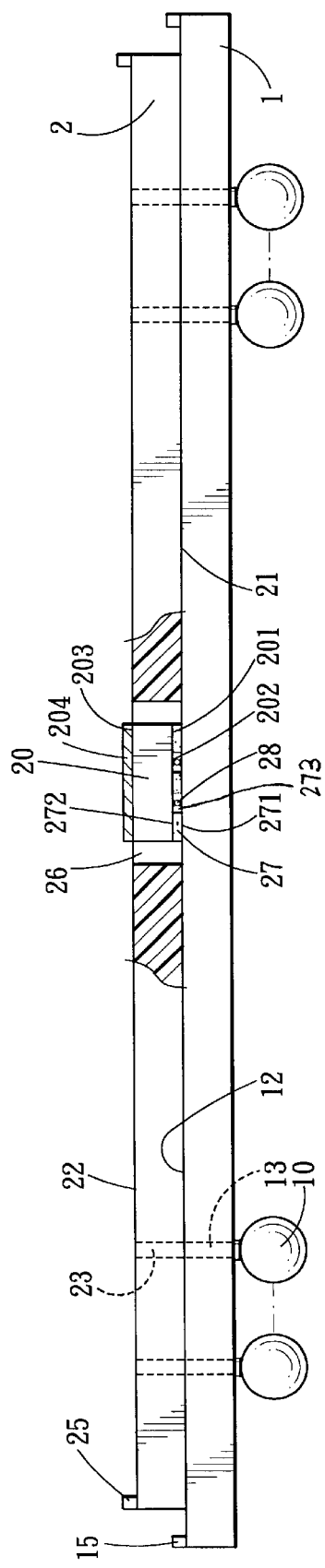

Referring to FIG. 2, a second substrate 2 having a size smaller than that of the first substrate 1 is provided. The second substrate 2 has opposite first and second surfaces 21, 22. The first surface 21 of the second substrate 2 is bonded on the second surface 12 of the first substrate 1 without covering the testing points 15 of the first substrate 1. Similarly, the second substrate 2 can be a printed circuit board, a metal plate covered with an insulating material, or a ceramic board. The second substrate 2 further has a plurality of second conductive vias 23 that extend through the first and second surfaces 21, 22 of the second substrate 2, a second circuit layout (not shown) which is similar to the first circuit layout 14 and which is patterned on the second surface 22 of the second substrate 2 and connected electrically to the second conductive vias 23 such that the second circuit layout is connected electrically to the first circuit layout through the first and second conductive vias 13, 23, a plurality of second testing points 25 disposed on the second surface 22 of the second substrate 2 and connected electrically to the second circuit layout, and a first chip-receiving opening 26 formed therein.

Figure 11:
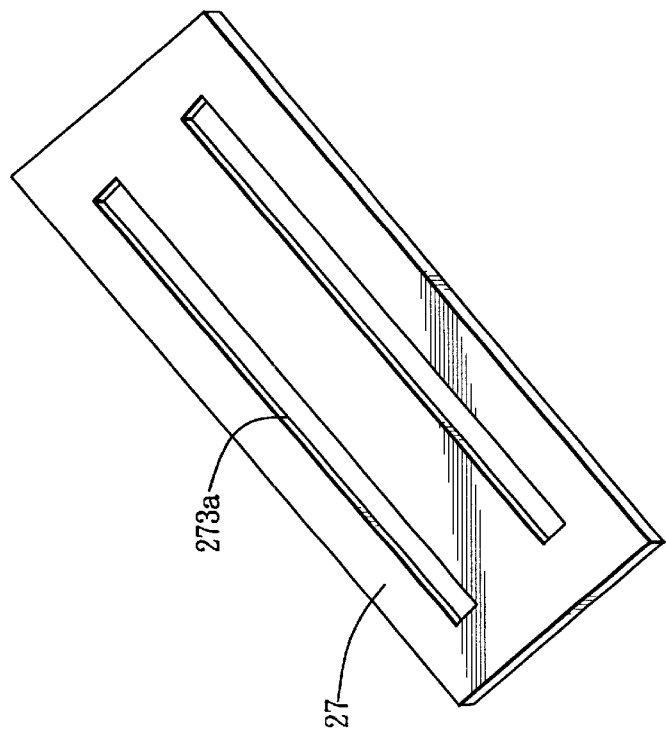
FIG. 11 is a perspective view showing a modification of the adhesive layer of FIG. 10.
Figure 10:
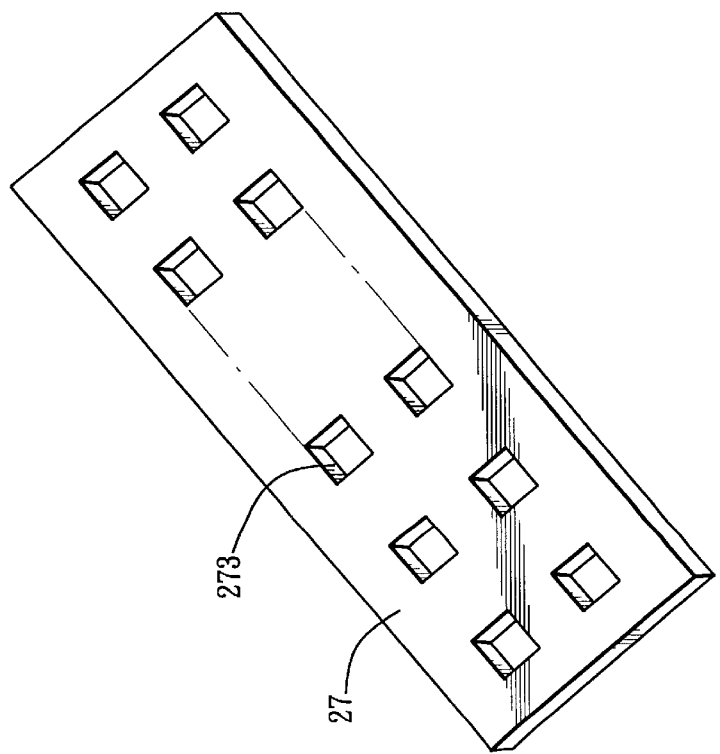
FIG. 10 is a perspective view showing a preferred embodiment of an adhesive layer in accordance with the present invention.

As shown in FIGS. 2 and 10, a first adhesive layer 27 having opposite first and second adhesive surfaces 271, 272 and a plurality of windows 273 that extend through the first and second adhesive surfaces 271, 272 is provided. The first adhesive surface 271 of the first adhesive layer 27 is adhered to the second surface 12 of the first substrate 1 such that the windows 273 of the first adhesive layer 27 permit access to the first circuit layout from the second adhesive surface 272 of the first adhesive layer 27. Alternatively, the windows 273 of the first adhesive layer 27 along a longitudinal axis can be replaced by an elongate slot 273a, as shown in FIG. 11.

A first semiconductor chip 20 having a first contact pad surface 201 on which a plurality of first contact pads 202 are formed, is disposed in the first chip-receiving opening 26. The first contact pad surface 201 of the first semiconductor chip 20 is adhered to the second adhesive surface 272 of the first adhesive layer 27.

A first conductive body 28 is placed in each of the windows 273 of the first adhesive layer 27 such that the first contact pads 202 of the first semiconductor chip 20 are connected electrically and respectively with the conductive bodies 28 in the windows 273 to establish electrical connection with the first circuit layout. A metal heat dissipating plate 204 is mounted on the surface 203 of the first semiconductor chip 20 opposite to the first contact pad surface 201.

Figure 14:
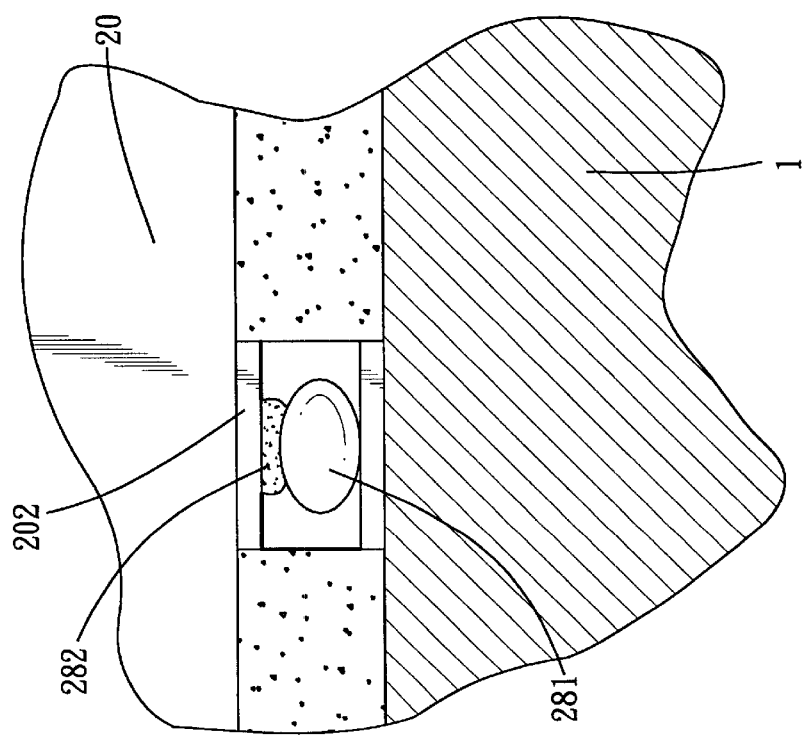
FIG. 14 is a fragmentary partly cross-sectional view showing a conductive body of the first preferred embodiment.

As shown in FIG. 14, each conductive body 28 consists of a conductive adhesive 282 connected electrically to the corresponding first contact pad 202 of the first semiconductor chip 20, and a metal ball 281 connected electrically to the first circuit layout of the first substrate 1. The conductive adhesive 282 can be a conductive silver adhesive or a solder paste. The metal ball 281 can be a solder ball or a conductive metal ball. The conductive adhesive 282 can also be doped with gold, copper, iron, or any other conductive metal material.

Figure 15:
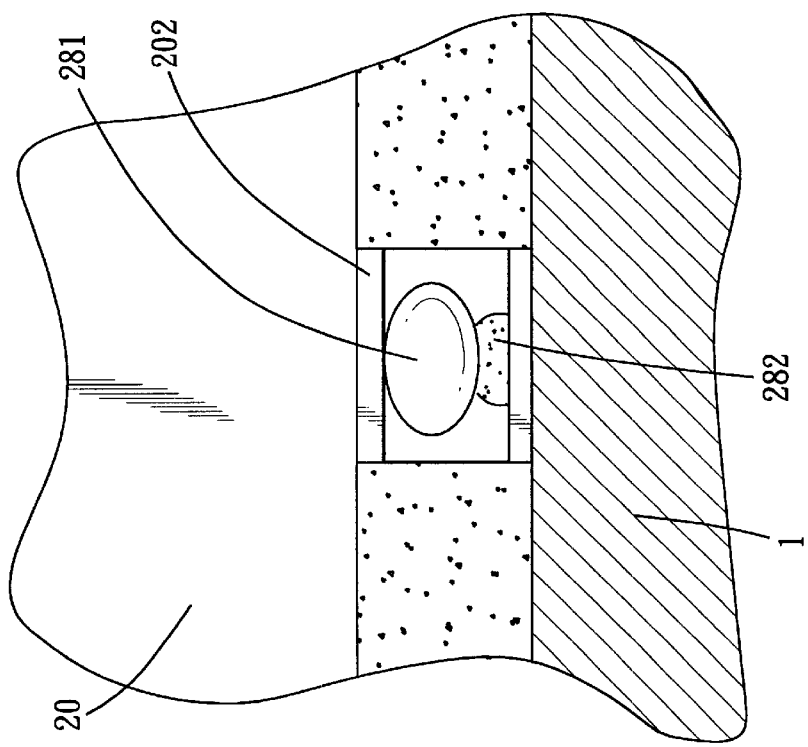
FIG. 15 is a fragmentary partly cross-sectional view showing another conductive body of the first preferred embodiment.

As shown in FIG. 15, the conductive adhesive 282 can also be connected electrically to the first circuit layout of the first substrate 1, and the metal ball 281 can be connected electrically to the first contact pad 202 of the first semiconductor chip 20.

It should be noted that, the first semiconductor chip 20 is tested through the first testing points 15 of the first substrate 1 at this stage so that replacement of the first semiconductor chip 20 can be conducted if the first semiconductor chip 20 is found to be defective. It should also be noted that, testing of the first semiconductor chip 20 could be carried out before the second substrate 2 is bonded to the first substrate 1.

Figure 3:
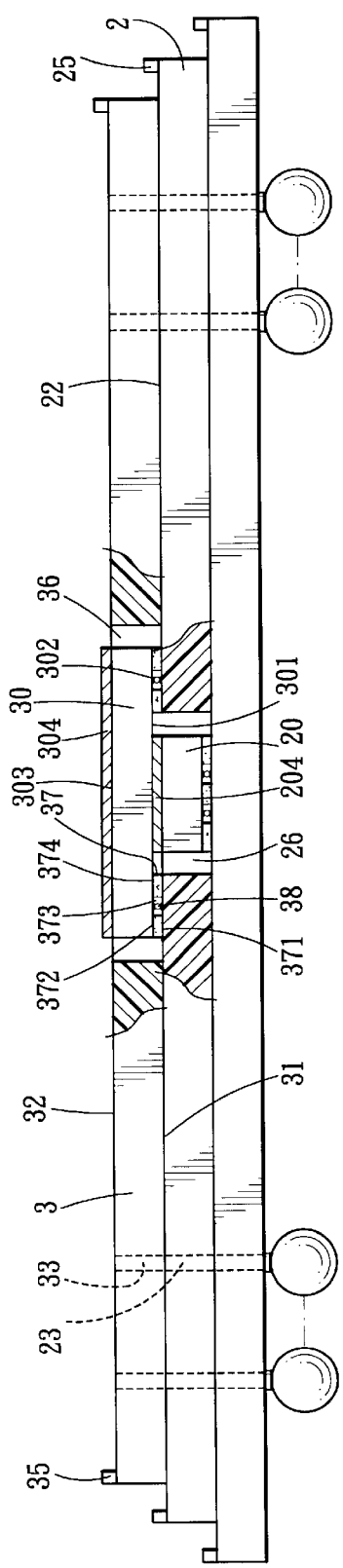

Reference is now made to FIG. 3, a third substrate 3 having a size smaller than that of the second substrate 2 is provided. The third substrate 3 has opposite first and second surfaces 31, 32. The first surface 31 of the third substrate 3 is bonded on the second surface 22 of the second substrate 2 without covering the testing points 25 of the second substrate 2. Similarly, the third substrate 3 can be a printed circuit board, a metal plate covered with an insulating material, or a ceramic board. The third substrate 3 further has a plurality of third conductive vias 33 that extend through the first and second surfaces 31, 32 of the third substrate 3, a third circuit layout (not shown) which is similar to the first circuit layout 14 and which is patterned on the second surface 32 of the third substrate 3 and connected electrically to the third conductive vias 33 such that the third circuit layout is connected electrically to the second circuit layout through the second and third conductive vias 23, 33, a plurality of third testing points 35 disposed on the second surface 32 of the third substrate 3 and connected electrically to the third circuit layout, and a second chip-receiving opening 36 larger than the first chip-receiving opening 26 formed therein.

Figure 12:
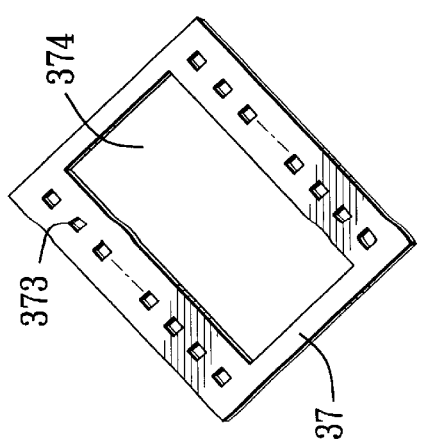
FIG. 12 is a perspective view showing a preferred embodiment of another adhesive layer in accordance with the present invention.

As shown in FIGS. 3 and 12, a second adhesive layer 37 has a first adhesive surface 371 adhered to the second surface 22 of the second substrate 2, and a second adhesive surface 372 opposite to the first adhesive surface 371. The second adhesive layer 37 further has a through-hole 374 which extends through the first and second adhesive surfaces 371, 372 thereof and which is registered with the first chip-receiving opening 26, and a plurality of windows 373 which extend through the first and second adhesive surfaces 371, 372 and which permit access to the second circuit layout of the second substrate 2 from the second adhesive surface 372.

A second semiconductor chip 30 having a second contact pad surface 301 on which a plurality of second contact pads 302 are formed, is disposed in the second chip-receiving opening 36 such that the first and second semiconductor chips 20, 30 are disposed on a common vertical axis. The second contact pad surface 301 of the second semiconductor chip 30 is adhered to the second adhesive surface 372 of the second adhesive layer 37 such that the second contact pads 302 are disposed around the first chip-receiving opening 26 of the second substrate 2.

A second conductive body 38 is placed in each of the windows 373 of the second adhesive layer 37 such that the second contact pads 302 of the second semiconductor chip 30 are connected electrically and respectively with the second conductive bodies 38 in the windows 373 to establish electrical connection with the second circuit layout of the second substrate 2. Since the structure of the second conductive body 38 is similar to that of the first conductive body 28, a detailed description thereof is omitted herein for the sake of brevity. A metal heat dissipating plate 304 is mounted on the surface 303 of the second semiconductor chip 30 opposite to the second contact pad surface 301 of the second semiconductor chip 30. The second contact pad surface 301 of the second semiconductor chip 30 has a contactless portion that abuts against the heat dissipating plate 204 on the first semiconductor chip 20.

It should be noted that, the second semiconductor chip 30 is tested through the second testing points 25 of the second substrate 2 at this stage so that replacement of the second semiconductor chip 30 can be conducted if the second semiconductor chip 30 is found to be defective. It should also be noted that, testing of the second semiconductor chip 30 could be carried out before the third substrate 3 is bonded to the second substrate 2.

Figure 13:
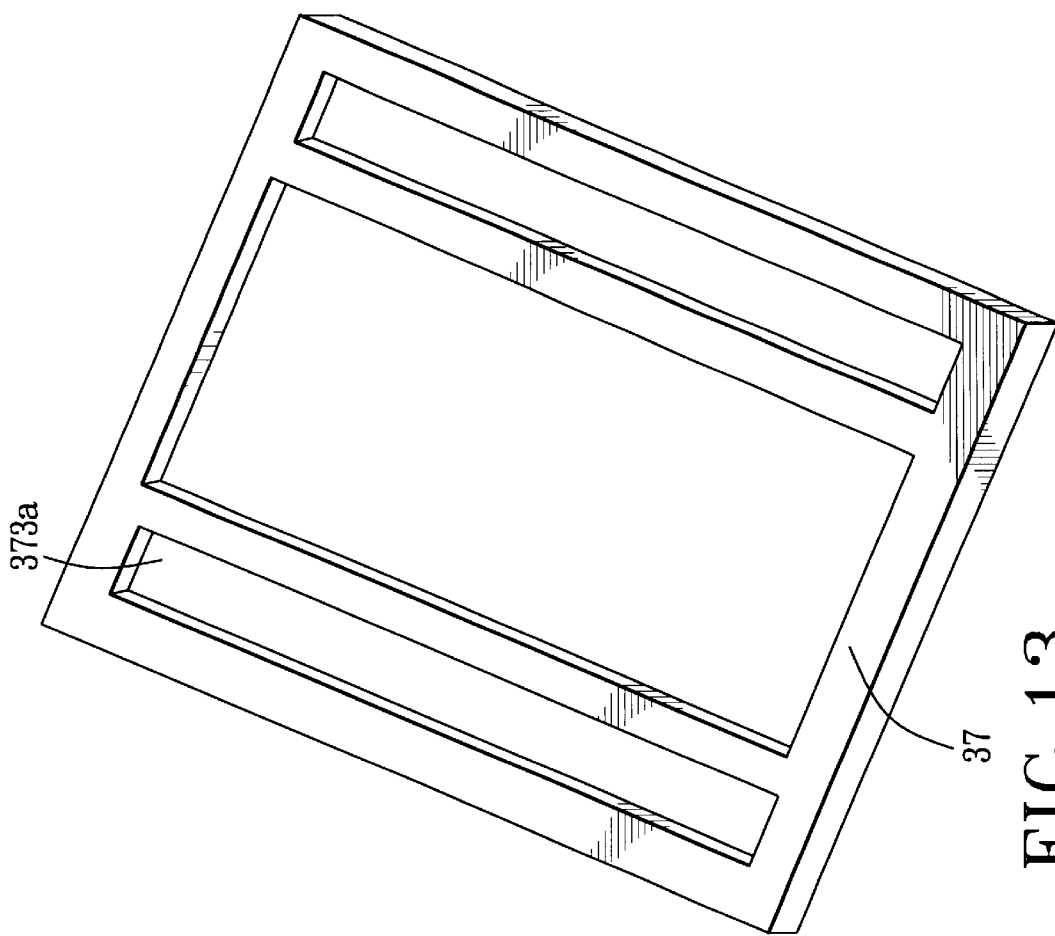
FIG. 13 is a perspective view showing a modification of the adhesive layer of FIG. 12.

Like the first adhesive layer 27, the windows 373 of the second adhesive layer 37 along a longitudinal axis can be replaced by an elongate slot 373a, as shown in FIG. 13.

Figure 4:
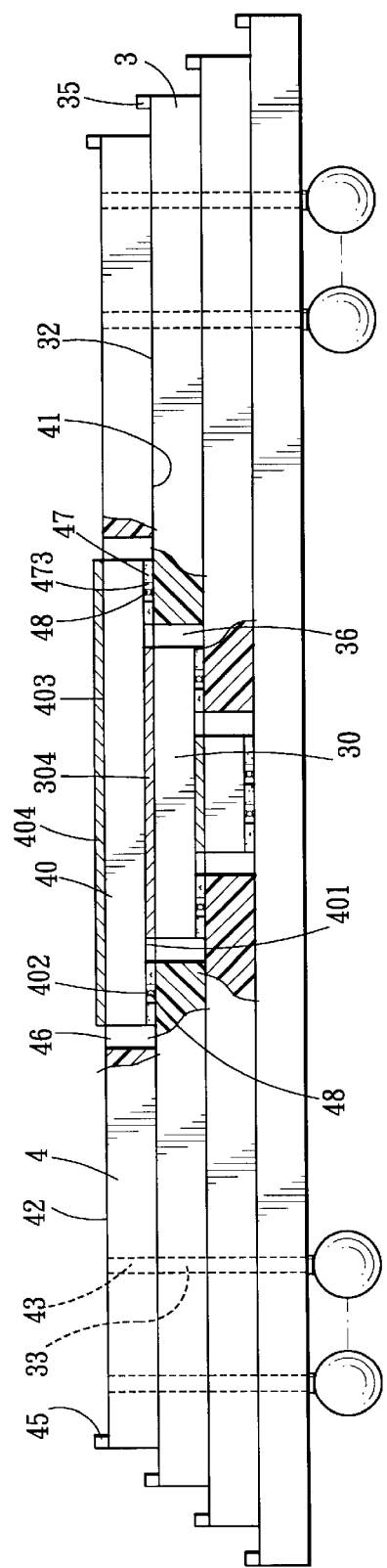

As shown in FIG. 4, a fourth substrate 4 having a size smaller than that of the third substrate 3 is provided. The fourth substrate 4 has opposite first and second surfaces 41, 42. The first surface 41 of the fourth substrate 4 is bonded on the second surface 32 of the third substrate 3 without covering the testing points 35 of the third substrate 3. Similarly, the fourth substrate 4 can be a printed circuit board, a metal plate covered with an insulating material, or a ceramic board. The fourth substrate 4 further has a plurality of fourth conductive vias 43 that extend through the first and second surfaces 41, 42 of the fourth substrate 4, a fourth circuit layout (not shown) which is similar to the first circuit layout 14 and which is patterned on the second surface 42 of the fourth substrate 4 and connected electrically to the fourth conductive vias 43 such that the fourth circuit layout is connected electrically to the third circuit layout through the third and fourth conductive vias 33, 43, a plurality of fourth testing points 45 disposed on the second surface 42 of the fourth substrate 4 and connected electrically to the fourth circuit layout, and a third chip-receiving opening 46 larger than the second chip-receiving opening 36 formed therein.

A third semiconductor chip 40 is disposed in the third chip-receiving opening 46 such that the second and third semiconductor chips 30, 40 are disposed on a common vertical axis. The third semiconductor chip 40 is mounted on the third substrate 3 in the same manner as the mounting of the second semiconductor chip 30 on the second substrate 2 by a third adhesive layer 47 having a structure similar to that of the second adhesive layer 37.

A third conductive body 48 is placed in each of the windows 473 of the third adhesive layer 47 such that the third contact pads 402 on the third contact pad surface 401 of the third semiconductor chip 40 are connected electrically and respectively with the third conductive bodies 48 in the windows 473 to establish electrical connection with the third circuit layout of the third substrate 3. The structure of the third conductive body 48 is similar to that of the first conductive body 28 described beforehand. A metal heat dissipating plate 404 is mounted on the surface 403 of the third semiconductor chip 40 opposite to the third contact pad surface 401 of the third semiconductor chip 40. The third contact pad surface 401 of the third semiconductor chip 40 has a contactless portion that abuts against the heat dissipating plate 304 on the second semiconductor chip 30.

It should be noted that, the third semiconductor chip 40 is tested through the third testing points 35 of the third substrate 3 at this stage so that replacement of the third semiconductor chip 40 can be conducted if the third semiconductor chip 40 is found to be defective. It should also be noted that, testing of the third semiconductor chip 40 could be carried out before the fourth substrate 4 is bonded to the third substrate 3.

Figure 5:
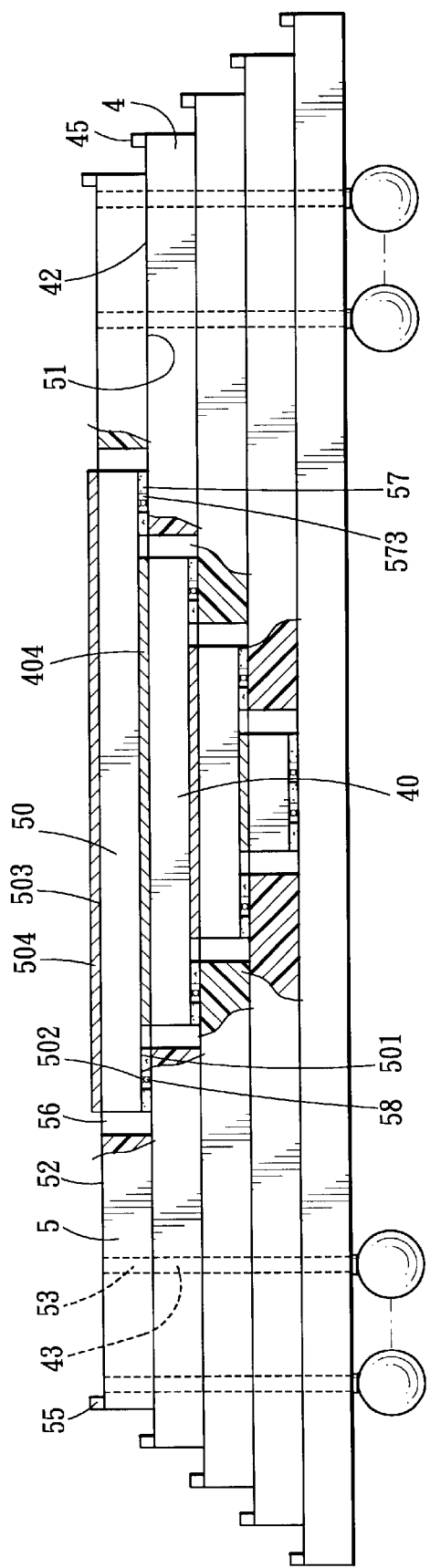

Reference is now made to FIG. 5, a fifth substrate 5 having a size smaller than that of the fourth substrate 4 is provided. The first to fifth substrates 1 to 5 cooperatively define a chip-mounting member. The fifth substrate 5 has opposite first and second surfaces 51, 52. The first surface 51 of the fifth substrate 5 is bonded on the second surface 42 of the fourth substrate 4 without covering the testing points 45 of the fourth substrate 4. Similarly, the fifth substrate 5 can be a printed circuit board, a metal plate covered with an insulating material, or a ceramic board. The fifth substrate 5 further has a plurality of fifth conductive vias 53 that extend through the first and second surfaces 51, 52 of the fifth substrate 5, a fifth circuit layout (not shown) which is similar to the first circuit layout 14 and which is patterned on the second surface 52 of the fifth substrate 5 and connected electrically to the fifth conductive vias 53 such that the fifth circuit layout is connected electrically to the fourth circuit layout through the fourth and fifth conductive vias 43, 53, a plurality of fifth testing points 55 disposed on the second surface 52 of the fifth substrate 5 and connected electrically to the fifth circuit layout, and a fourth chip-receiving opening 56 larger than the third chip-receiving opening 46 formed therein.

A fourth semiconductor chip 50 is disposed in the fourth chip-receiving opening 56 such that the third and fourth semiconductor chips 40, 50 are disposed on a common vertical axis. The fourth semiconductor chip 50 is mounted on the fourth substrate 4 in the same manner as the mounting of the second semiconductor chip 30 on the second substrate by a fourth adhesive layer 57 having a structure similar to that of the second adhesive layer 37.

A fourth conductive body 58 is placed in each of the windows 573 of the fourth adhesive layer 57 such that the fourth contact pads 502 on the fourth contact pad surface 401 of the fourth semiconductor chip 50 are connected electrically and respectively with the fourth conductive bodies 58 in the windows 573 to establish electrical connection with the fourth circuit layout of the fourth substrate 4. The structure of the fourth conductive body 58 is similar to that of the first conductive body 28 described beforehand. A metal heat dissipating plate 504 is mounted on the surface 503 of the fourth semiconductor chip 50 opposite to the fourth contact pad surface 501 of the fourth semiconductor chip 50. The fourth contact pad surface 501 of the fourth semiconductor chip 50 has a contactless portion that abuts against the heat dissipating plate 404 on the third semiconductor chip 40.

It should be noted that, the fourth semiconductor chip 50 is tested through the fourth testing points 45 of the fourth substrate 4 at this stage so that replacement of the fourth semiconductor chip 50 can be conducted if the fourth semiconductor chip 50 is found to be defective. It should also be noted that, testing of the fourth semiconductor chip 50 could be carried out before the fifth substrate 5 is bonded to the fourth substrate 4.

Figure 6:
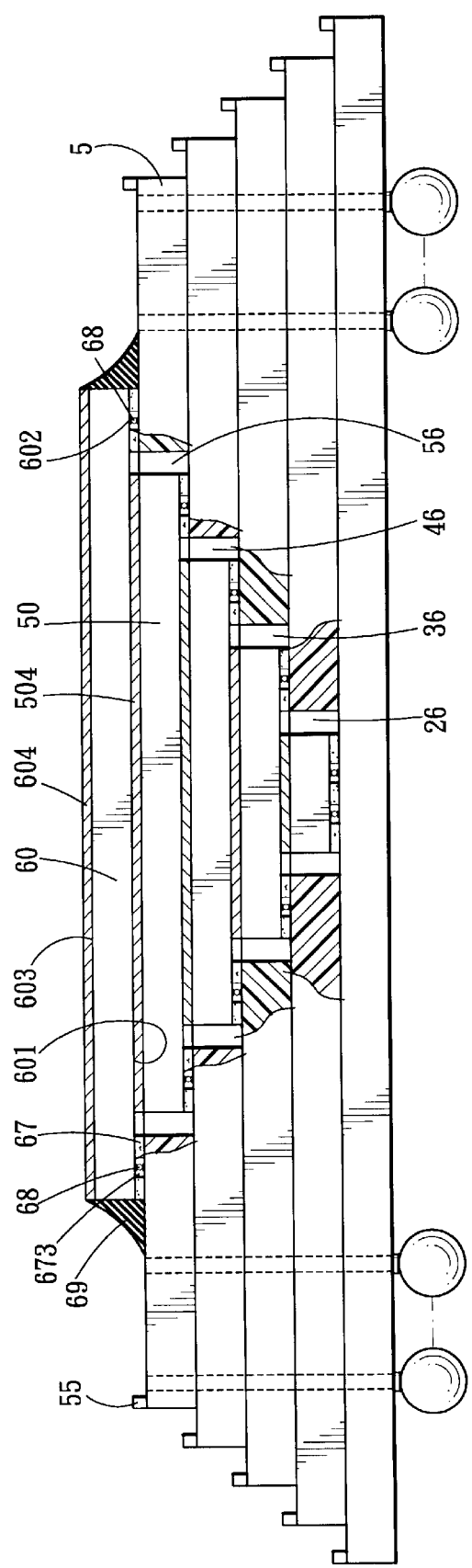

As shown in FIG. 6, a fifth semiconductor chip 60 is mounted on the second surface 52 of the fifth substrate 5 in the same manner as the mounting of the second semiconductor chip 30 on the second substrate 2 by a fifth adhesive layer 67 having a structure similar to that of the second adhesive layer 37.

A fifth conductive body 68 is placed in each of the windows 673 of the fifth adhesive layer 67 such that the fifth contact pads 602 on the fifth contact pad surface 601 of the fifth semiconductor chip 60 are connected electrically and respectively with the fifth conductive bodies 68 in the windows 673 to establish electrical connection with the fifth circuit layout of the fifth substrate 5. The structure of the fifth conductive body 68 is similar to that of the first conductive body 28 described beforehand. A metal heat dissipating plate 604 is mounted on the surface 603 of the fifth semiconductor chip 60 opposite to the fifth contact pad surface 601 of the fifth semiconductor chip 60. The fifth contact pad surface 601 of the fifth semiconductor chip 60 has a contactless portion that abuts against the heat dissipating plate 504 on the fourth semiconductor chip 50.

It should be noted that, the fifth semiconductor chip 60 is tested through the fifth testing points 55 of the fifth substrate 5 at this stage so that replacement of the fifth semiconductor chip 60 can be conducted if the fifth semiconductor chip 60 is found to be defective.

An encapsulation layer 69 is disposed on the second surface 52 of the fifth substrate 5 around the fifth semiconductor chip 60 for protecting the latter against external forces and moisture. In this preferred embodiment, the encapsulation layer 69 is made of a metal material. Alternatively, the encapsulation layer 69 can be made of epoxy resin. It should be noted that, when the encapsulation layer 69 is made of epoxy resin, portions of the chip-receiving openings 26, 36, 46, 56 that are not occupied by the corresponding semiconductor chips 20, 30, 40, 50 are preferably also filled with epoxy resin.

Figure 7:
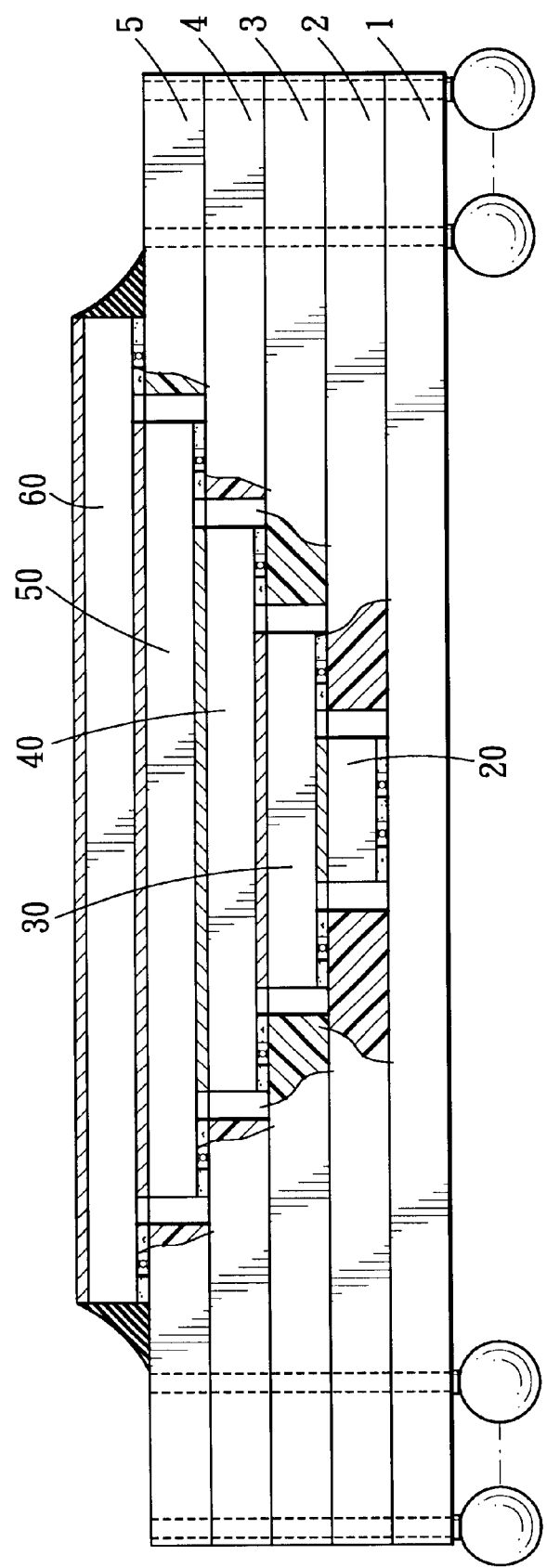

As shown in FIG. 7, the first to fifth substrates 1 to 5 are finally trimmed to form the first to fifth substrates 1 to 5 with common vertical edges.

It should be noted that, the semiconductor chips 20 to 60 can have different functions. For example, the first semiconductor chip 20 can be a memory unit, the second semiconductor chip 30 can be an input/output control unit, the third semiconductor chip 40 can be a graphics control unit, the fourth semiconductor chip 50 can be a chipset unit, and the fifth semiconductor chip 60 can be a central processing unit (CPU).

According to the above description of the preferred embodiment, the process for manufacturing a multi-chip semiconductor module of this invention combines a testing procedure. Therefore, the yield rate for manufacturing the multi-chip semiconductor module can reach up to 100%, and hence, the cost of repairing defective semiconductor modules is reduced. The overall production cost can thus be reduced.

Figure 8:
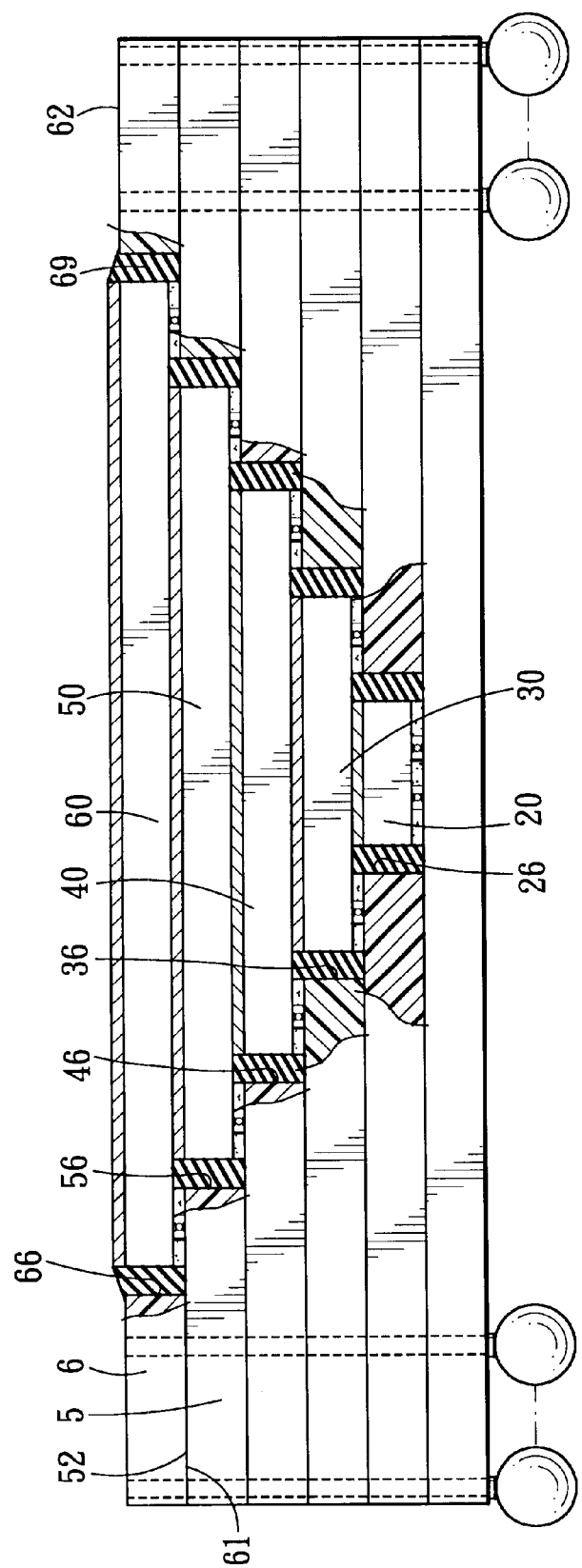
FIG. 8 is a schematic partly cross-sectional view showing a multi-chip semiconductor module in accordance with a second preferred embodiment of the present invention.

Reference is now made to FIG. 8, which illustrates a second preferred embodiment of the present invention. Unlike the first preferred embodiment, the chip-mounting member of the multi-chip semiconductor module of the present embodiment further includes a sixth substrate 6 having opposite first and second surfaces 61, 62 and a fifth chip-receiving opening 66 formed therein. The first surface 61 of the sixth substrate 6 is bonded on the second surface 52 of the fifth substrate 5 such that the fifth semiconductor chip 60 is disposed in the fifth chip-receiving opening 66. It should be noted that, the encapsulation layer 69 is made of epoxy resin in this preferred embodiment so that portions of the chip-receiving openings 26, 36, 46, 56 that are not occupied by the corresponding semiconductor chips 20, 30, 40, 50 are also filled with epoxy resin.

FIGS. 16 to 22 illustrate the process for manufacturing a multi-chip semiconductor module in accordance with a third preferred embodiment of the present invention.

Figure 16:
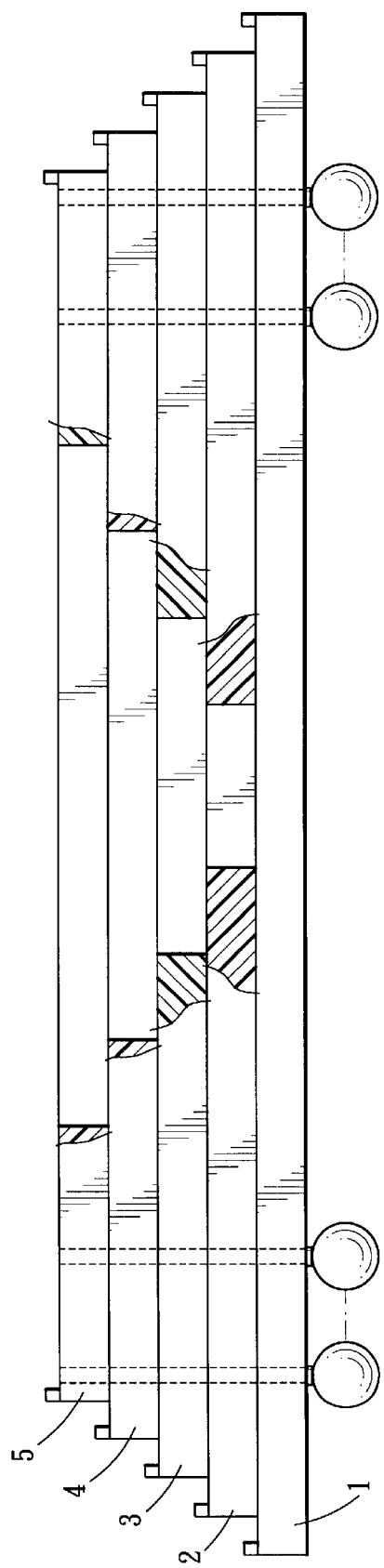
FIGS. 16 to 22 are schematic partly cross-sectional views showing a manufacturing process for a multi-chip semiconductor module in accordance with a third preferred embodiment of the present invention.

As shown in FIG. 16, a chip-mounting member is provided. The chip mounting member includes first to fifth substrates 1 to 5. Since the structures of the first to fifth substrates 1 to 5 of the present embodiment are similar to those of the first preferred embodiment, detailed descriptions thereof are omitted herein for the sake of brevity.

Figure 17:
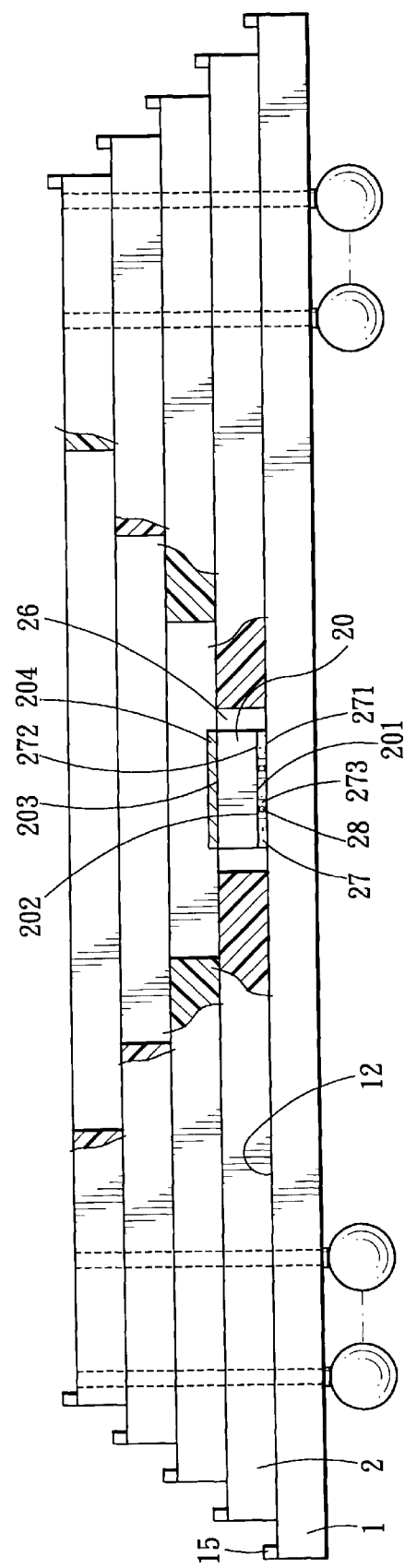

Reference is now made to FIG. 17. A first adhesive layer 27 having a structure similar to that of the first preferred embodiment is provided. The first adhesive surface 271 of the first adhesive layer 27 is adhered to the second surface 12 of the first substrate 1 such that the windows 273 of the first adhesive layer 27 permit access to the first circuit layout on the first substrate 1 from the second adhesive surface 272 of the first adhesive layer 27.

A first semiconductor chip 20 having a first contact pad surface 201 on which a plurality of first contact pads 202 are formed, is disposed in the first chip-receiving opening 26 of the second substrate 2. The first contact pad surface 201 of the first semiconductor chip 20 is adhered to the second adhesive surface 272 of the first adhesive layer 27.

A first conductive body 28 having a structure similar to that described beforehand is placed in each of the windows 273 of the first adhesive layer 27 such that the first contact pads 202 of the first semiconductor chip 20 are connected electrically and respectively with the conductive bodies 28 in the windows 273 to establish electrical connection with the first circuit layout. A metal heat dissipating plate 204 is mounted on the surface 203 of the first semiconductor chip 20 opposite to the first contact pad surface 201 of the first semiconductor chip 20.

It should be noted that, the first semiconductor chip 20 is tested through the first testing points 15 of the first substrate 1 at this stage so that replacement of the first semiconductor chip 20 can be conducted if the first semiconductor chip 20 is found to be defective.

Figure 18:
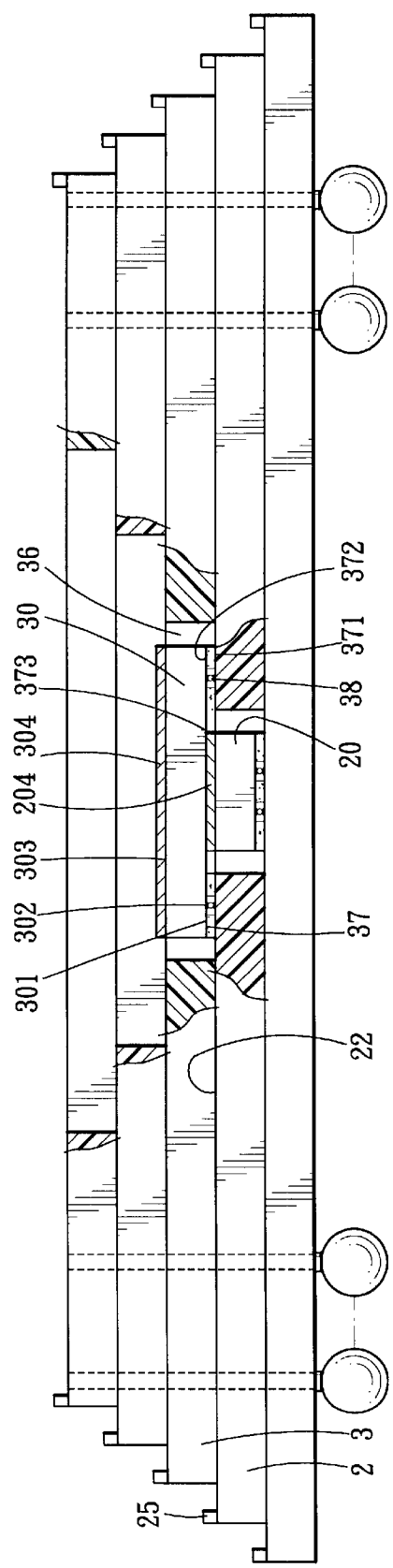

As shown in FIG. 18, a second adhesive layer 37 having a structure similar to that of the first preferred embodiment is provided. The first adhesive surface 371 of the second adhesive layer 37 is adhered to the second surface 22 of the second substrate 2.

A second semiconductor chip 30 having a second contact pad surface 301 on which a plurality of second contact pads 302 are formed, is disposed in the second chip-receiving opening 36 of the third substrate 3 such that the first and second semiconductor chips 20, 30 are disposed on a common vertical axis. The second contact pad surface 301 of the second semiconductor chip 30 is adhered to the second adhesive surface 372 of the second adhesive layer 37.

A second conductive body 38 is placed in each of the windows 373 of the second adhesive layer 37 such that the second contact pads 302 on the second contact pad surface 301 of the second semiconductor chip 30 are connected electrically and respectively with the second conductive bodies 38 in the windows 373 to establish electrical connection with the second circuit layout of the second substrate 2. A metal heat dissipating plate 304 is mounted on the surface 303 of the second semiconductor chip 30 opposite to the second contact pad surface 301 of the second semiconductor chip 30. The second contact pad surface 301 of the second semiconductor chip 30 has a contactless portion that abuts against the heat dissipating plate 204 on the first semiconductor chip 20.

It should be noted that, the second semiconductor chip 30 is tested through the second testing points 25 of the second substrate 2 at this stage so that replacement of the second semiconductor chip 30 can be conducted if the second semiconductor chip 30 is found to be defective.

Figure 19:
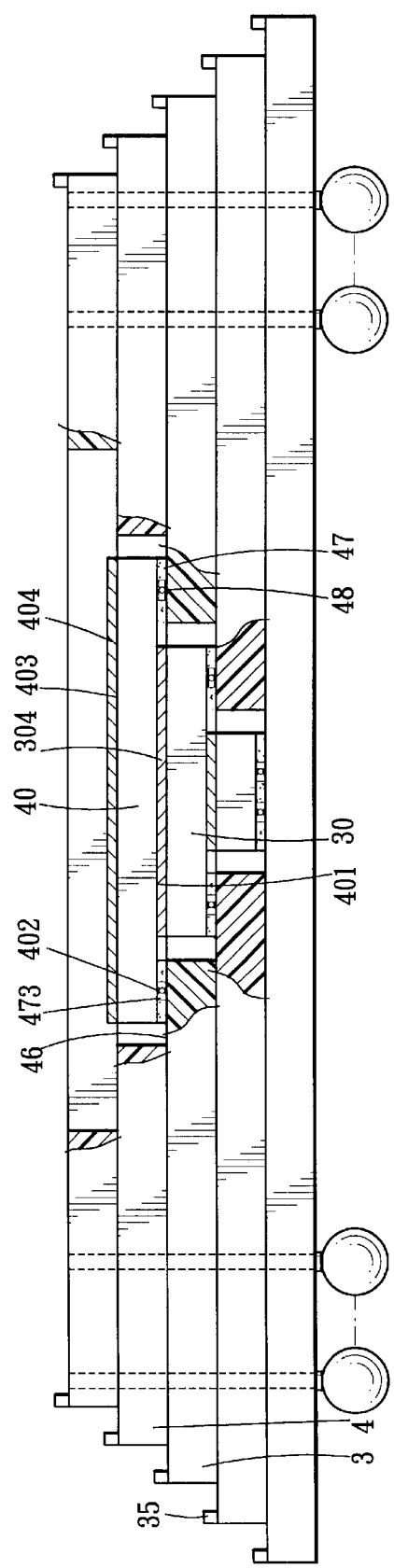

As shown in FIG. 19, a third semiconductor chip 40 is disposed in the third chip-receiving opening 46 of the fourth substrate 4 such that the second and third semiconductor chips 30, 40 are disposed on a common vertical axis. The third semiconductor chip 40 is mounted on the third substrate 3 in the same manner as the mounting of the second semiconductor chip 30 on the second substrate 2 by a third adhesive layer 47 having a structure similar to that of the second adhesive layer 37.

A third conductive body 48 is placed in each of the windows 473 of the third adhesive layer 47 such that the third contact pads 402 on the third contact pad surface 401 of the third semiconductor chip 40 are connected electrically and respectively with the third conductive bodies 48 in the windows 473 to establish electrical connection with the third circuit layout of the third substrate 3. A metal heat dissipating plate 404 is mounted on the surface 403 of the third semiconductor chip 40 opposite to the third contact pad surface 401 of the third semiconductor chip 40. The third contact pad surface 401 of the third semiconductor chip 40 has a contactless portion that abuts against the heat dissipating plate 304 on the second semiconductor chip 30.

It should be noted that, the third semiconductor chip 40 is tested through the third testing points 35 of the third substrate 3 at this stage so that replacement of the third semiconductor chip 40 can be conducted if the third semiconductor chip 40 is found to be defective.

Figure 20:
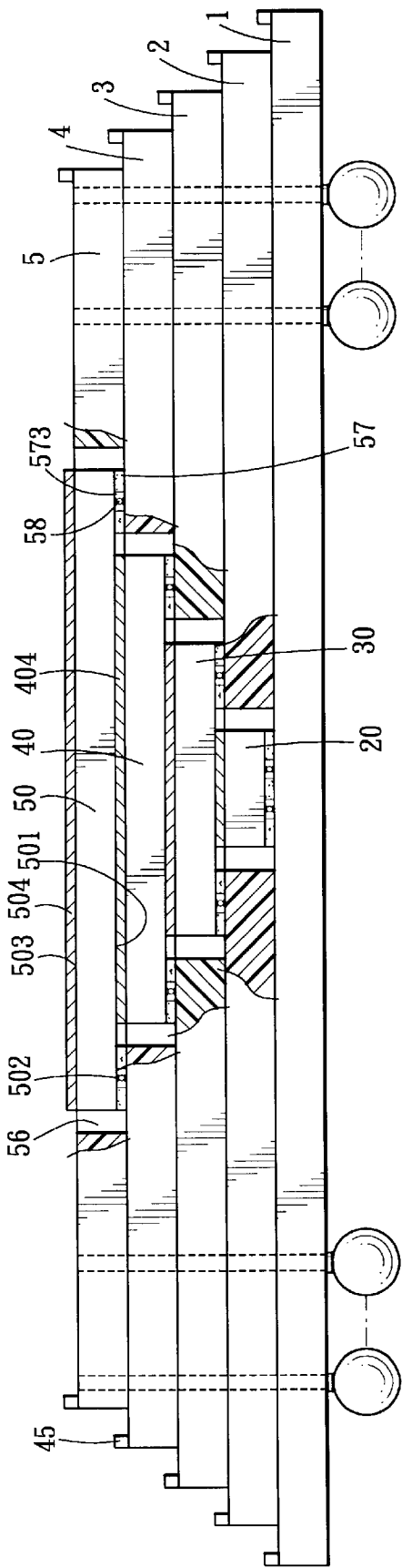

Referring to FIG. 20, a fourth semiconductor chip 50 is disposed in the fourth chip-receiving opening 56 of the fifth substrate 5 such that the third and fourth semiconductor chips 40, 50 are disposed on a common vertical axis. The fourth semiconductor chip 50 is mounted on the fourth substrate 4 in the same manner as the mounting of the second semiconductor chip 30 on the second substrate 2 by a fourth adhesive layer 57 having a structure similar to that of the second adhesive layer 37.

A fourth conductive body 58 is placed in each of the windows 573 of the fourth adhesive layer 57 such that the fourth contact pads 502 on the fourth contact pad surface 501 of the fourth semiconductor chip 50 are connected electrically and respectively with the fourth conductive bodies 58 in the windows 573 to establish electrical connection with the fourth circuit layout of the fourth substrate 4. A metal heat dissipating plate 504 is mounted on the surface 503 of the fourth semiconductor chip 50 opposite to the fourth contact pad surface 501 of the fourth semiconductor chip 50. The fourth contact pad surface 501 of the fourth semiconductor chip 50 has a contactless portion that abuts against the heat dissipating plate 404 on the third semiconductor chip 40.

It should be noted that, the fourth semiconductor chip 50 is tested through the fourth testing points 45 of the fourth substrate 4 at this stage so that replacement of the fourth semiconductor chip 50 can be conducted if the fourth semiconductor chip 50 is found to be defective.

Figure 21:
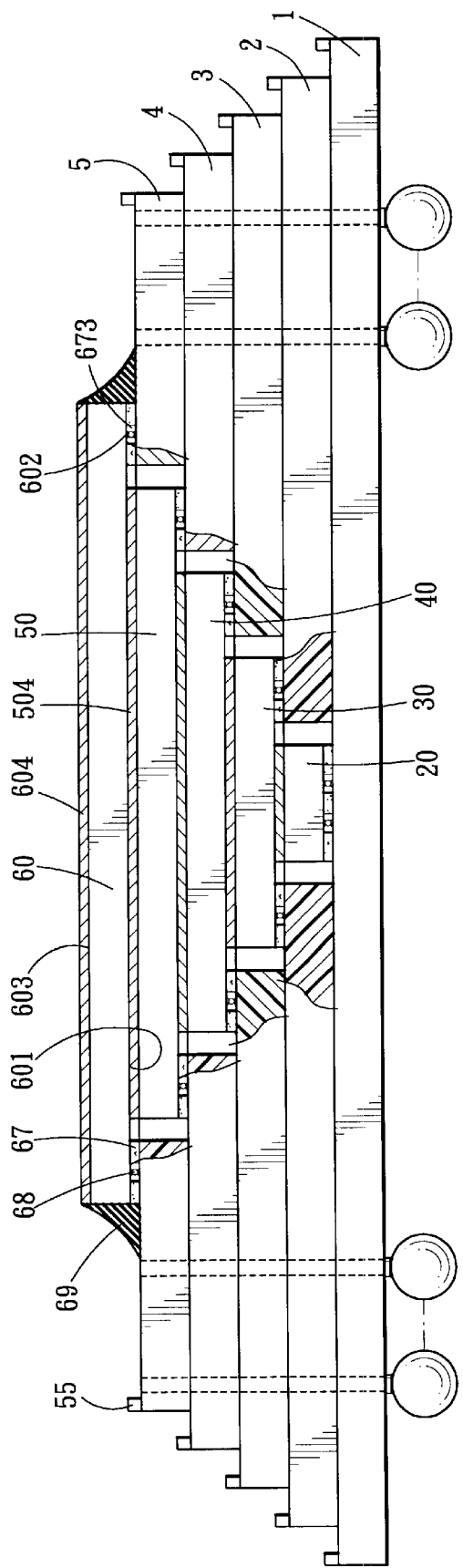

As shown in FIG. 21, a fifth semiconductor chip 60 is mounted on the second surface 52 of the fifth substrate 5 in the same manner as the mounting of the second semiconductor chip 30 on the second substrate 2 by a fifth adhesive layer 67 having a structure similar to that of the second adhesive layer 37.

A fifth conductive body 68 is placed in each of the windows 673 of the fifth adhesive layer 67 such that the fifth contact pads 602 on the fifth contact pad surface 601 of the fifth semiconductor chip 60 are connected electrically and respectively with the fifth conductive bodies 68 in the windows 673 to establish electrical connection with the fifth circuit layout of the fifth substrate 5. A metal heat dissipating plate 604 is mounted on the surface 603 of the fifth semiconductor chip 60 opposite to the fifth contact pad surface 601 of the fifth semiconductor chip 60. The fifth contact pad surface 601 of the fifth semiconductor chip 60 has a contactless portion that abuts against the heat dissipating plate 504 on the fourth semiconductor chip 50.

It should be noted that, the fifth semiconductor chip 60 is tested through the fifth testing points 55 of the fifth substrate 5 at this stage so that replacement of the fifth semiconductor chip 60 can be conducted if the fifth semiconductor chip 60 is found to be defective.

An encapsulation layer 69 made of a metal material is disposed on the second surface 52 of the fifth substrate 5 around the fifth semiconductor chip 60 to protect the latter against external forces and moisture.

Figure 22:
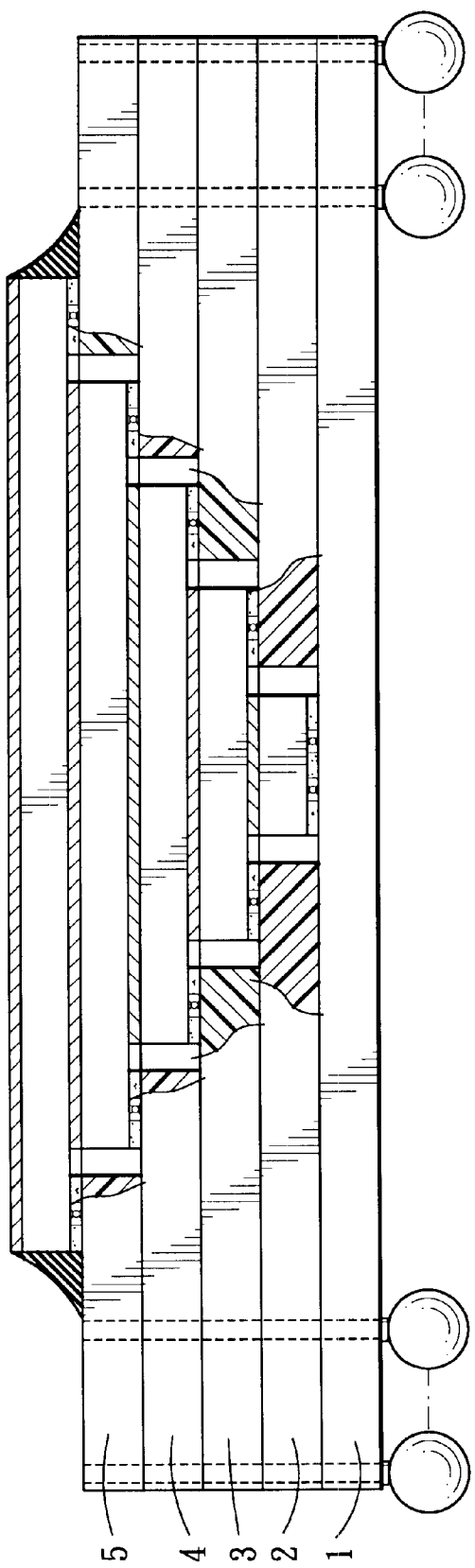

As shown in FIG. 22, the first to fifth substrates 1 to 5 are finally trimmed to form the first to fifth substrates 1 to 5 with common vertical edges.

Figure 23:
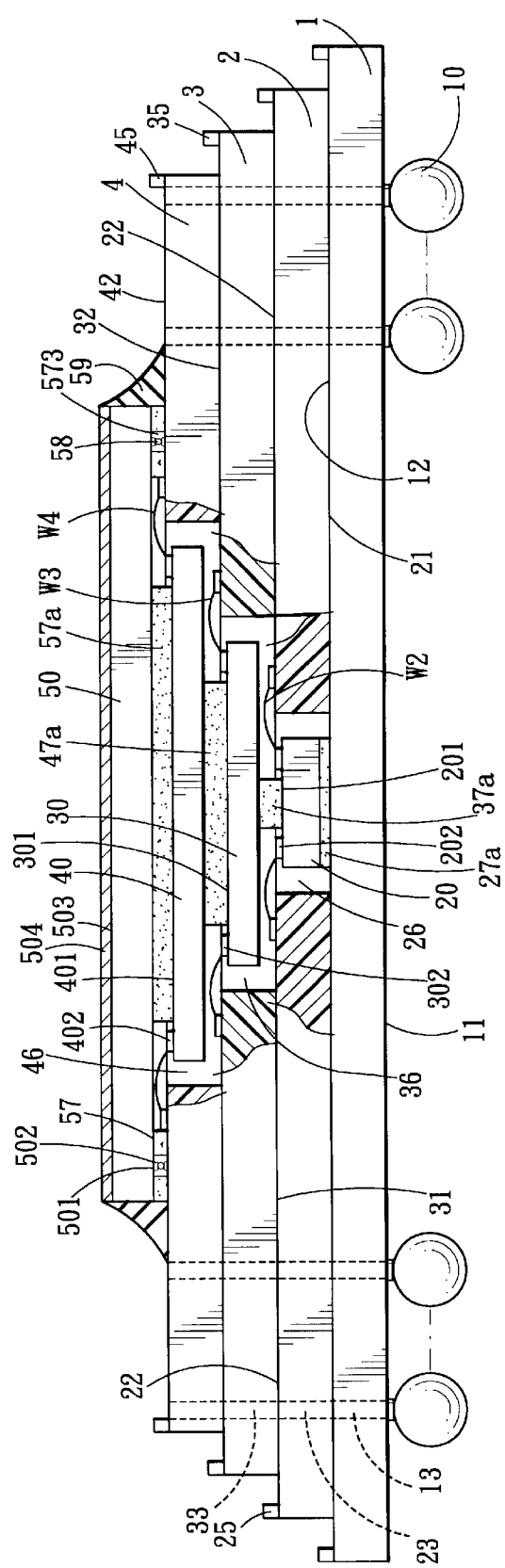
FIG. 23 is a schematic partly cross-sectional view showing a multi-chip semiconductor module in accordance with a fourth preferred embodiment of the present invention.

FIG. 23 shows a multi-chip semiconductor module in accordance with a fourth preferred embodiment of the present invention.

The chip-mounting member of the present embodiment includes first to fourth substrates 1 to 4. The first substrate 1 has opposite first and second surfaces 11, 12, a plurality of first conductive vias 13 that extend through the first and second surfaces 11, 12, and a plurality of solder balls 10 that are mounted on the first surface 11 of the first substrate 1 at positions corresponding to the first conductive vias 13 such that the solder balls 10 are connected electrically and respectively to the first conductive vias 13.

The second substrate 2 has opposite first and second surfaces 21, 22, a plurality of second conductive vias 23 that extend through the first and second surfaces 21, 22 of the second substrate 2, a first circuit layout patterned on the second surface 22 of the second substrate 2 and connected electrically to the second conductive vias 23, a plurality of first testing points 25 disposed on the second surface 22 of the second substrate 2 and connected electrically to the first circuit layout, and a first chip-receiving opening 26 formed therein. Since the first circuit layout is similar to that of the first preferred embodiment, it is not illustrated in the present embodiment. The first surface 21 of the second substrate 2 is bonded on the second surface 12 of the first substrate 1 such that the first circuit layout is connected electrically to the first conductive vias 13 through the second conductive vias 23.

The third substrate 3 has opposite first and second surfaces 31, 32, a plurality of third conductive vias 33 that extend through the first and second surfaces 31, 32 of the third substrate 3, a second circuit layout patterned on the second surface 32 of the third substrate 3 and connected electrically to the third conductive vias 33, a plurality of second testing points 35 disposed on the second surface 32 of the third substrate 3 and connected electrically to the second circuit layout, and a second chip-receiving opening 36 larger than the first chip-receiving opening 26 formed therein. The second circuit layout is similar to the first circuit layout of the present embodiment. The first surface 31 of the third substrate 3 is bonded on the second surface 22 of the second substrate 2 such that the second circuit layout is connected electrically to the first circuit layout through the second and third conductive vias 23, 33, such that the first and second chip-receiving openings 26, 36 are disposed on a common vertical axis, and such that the third substrate 3 does not cover the first testing points 25.

The fourth substrate 4 has a structure similar to that of the third substrate 3, and is mounted on the third substrate 3 in the same manner as the mounting of the third substrate 3 on the second substrate 2.

A first semiconductor chip 20 having one side 201 provided with a plurality of first contact pads 202 is disposed in the first chip-receiving opening 26 and is mounted on the second surface 12 of the first substrate 1 by an adhesive layer 27a. The first contact pads 202 of the first semiconductor chip 20 are wire-bonded to the first circuit layout of the second substrate 2 with the use of wires (w2).

The first semiconductor chip 20 is tested through the first testing points 25 at this stage so that replacement of the first semiconductor chip 20 can be conducted if the first semiconductor chip 20 is found to be defective.

A second semiconductor chip 30 having one side 301 provided with a plurality of second contact pads 302 is disposed in the second chip-receiving opening 36 and is mounted on the side 201 of the first semiconductor chip 20 by an adhesive layer 37a such that the second semiconductor chip 30 is spaced apart from the second surface 22 of the second substrate 2 along the vertical axis. The second contact pads 302 of the second semiconductor chip 30 are wire-bonded to the second circuit layout of the third substrate 3 with the use of wires (w3).

The second semiconductor chip 30 is tested through the second testing points 35 of the third substrate 3 at this stage so that replacement of the second semiconductor chip 30 can be conducted if the second semiconductor chip 30 is found to be defective.

A third semiconductor chip 40 having one side 401 provided with a plurality of third contact pads 402 is disposed in the third chip-receiving opening 46 of the fourth substrate 4 and is mounted on the side 301 of the second semiconductor chip 30 by an adhesive layer 47a such that the third semiconductor chip 40 is spaced apart from the second surface 32 of the third substrate 3 along the vertical axis. The third contact pads 402 of the third semiconductor chip 40 are wire-bonded to the third circuit layout of the fourth substrate 4 with the use of wires (w4).

The third semiconductor chip 40 is tested through the third testing points 45 on the fourth substrate 4 at this stage so that replacement of the third semiconductor chip 40 can be conducted if the third semiconductor chip 40 is found to be defective.

A fourth semiconductor chip 50 is mounted on the second surface 42 of the fourth substrate 4 in the same manner as the mounting of the second semiconductor chip of the first preferred embodiment on the second substrate by an adhesive layer 57 having a structure similar to that of the second adhesive layer 37 of the first preferred embodiment.

A conductive body 58 is placed in each of the windows 573 of the adhesive layer 57 such that the fourth contact pads 502 on the fourth contact pad surface 501 of the fourth semiconductor chip 50 are connected electrically and respectively with the conductive bodies 58 in the windows 573 to establish electrical connection with the third circuit layout of the fourth substrate 4. A metal heat dissipating plate 504 is mounted on the surface 503 of the fourth semiconductor chip 50 opposite to the fourth contact pad surface 501 of the fourth semiconductor chip 50. The fourth contact pad surface 501 of the fourth semiconductor chip 50 has a contactless portion to which one adhesive surface of an adhesive layer 57a is adhered. The other adhesive surface of the adhesive layer 57a is adhered to the side 401 of the third semiconductor chip 40.

The fourth semiconductor chip 50 may also be tested through the third testing points 45 of the fourth substrate 4 at this stage so that replacement of the fourth semiconductor chip 50 can be conducted if the fourth semiconductor chip 50 is found to be defective.

An encapsulation layer 59 made of a metal material is disposed on the second surface 42 of the fourth substrate 4 around the fourth semiconductor chip 50 for protecting the latter against external forces and moisture.

Like the previous embodiments, the first to fourth substrates 1 to 4 will be finally trimmed to form the first to fourth substrates 1 to 4 with common vertical edges.

Figure 24:
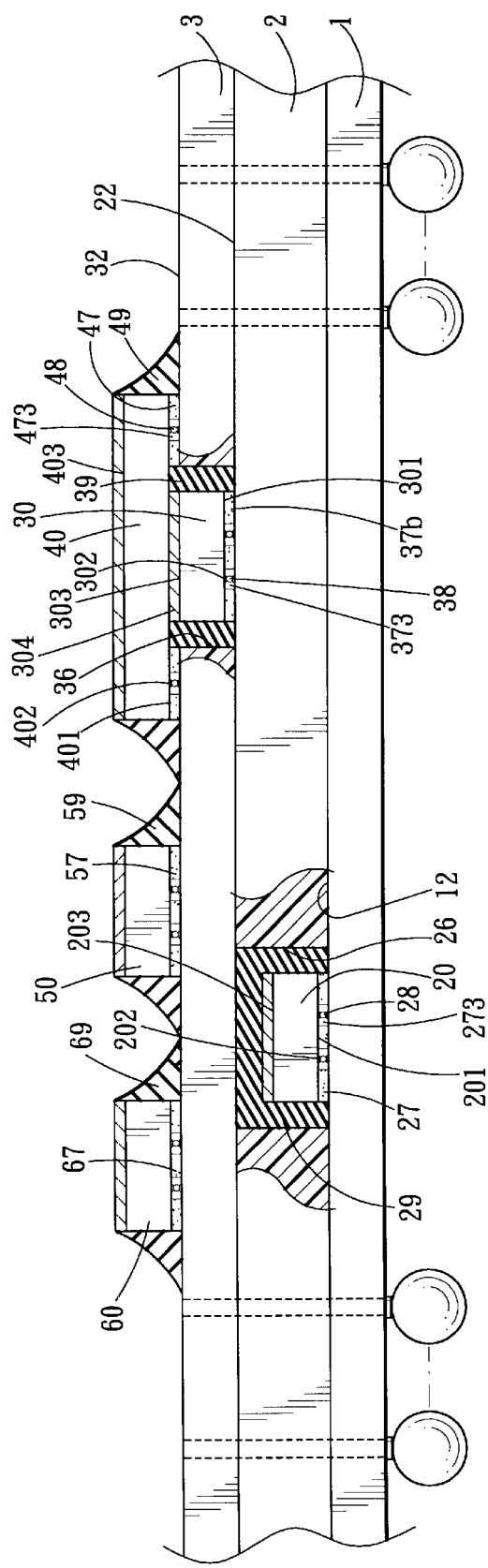
FIG. 24 is a schematic partly cross-sectional view of a portion of a multi-chip semiconductor module in accordance with a fifth preferred embodiment of the present invention.

Reference is made to FIG. 24, which illustrates a portion of a multi-chip semiconductor module in accordance with a fifth preferred embodiment of the present invention. In the present embodiment, the chip-mounting member includes first, second and third substrates 1, 2, 3. The structures of the first to third substrates 1 to 3 are generally similar to those of the first preferred embodiment, except that the second chip-receiving opening 36 is not larger than the first chip-receiving opening 26 and that the first and second chip-receiving openings 26, 36 are not disposed on a common vertical axis.

A first semiconductor chip 20 is disposed in the first chip-receiving opening 26 and is mounted on the second surface 12 of the first substrate 1 in the same manner as described in the first preferred embodiment by a first adhesive layer 27 having a structure similar to that of the first adhesive layer of the first preferred embodiment.

A first conductive body 28 is placed in each of the windows 273 of the first adhesive layer 27 such that the first contact pads 202 on the first contact pad surface 201 of the first semiconductor chip 20 are connected electrically and respectively with the conductive bodies 28 in the windows 273 to establish electrical connection with the first circuit layout of the first substrate 1. A metal heat dissipating plate 204 is mounted on the surface 203 of the first semiconductor chip 20 opposite to the first contact pad surface 201 of the first semiconductor chip 20.

It should be noted that, the first semiconductor chip 20 is tested through first testing points (not shown) of the first substrate 1 before the second substrate 2 is bonded to the first substrate 1. It should also be noted that, a portion of the first chip-receiving opening 26 not occupied by the first semiconductor chip 20 is filled with, for example, epoxy resin 29, to protect the first semiconductor chip 20 against moisture.

A second semiconductor chip 30 is disposed in the second chip-receiving opening 36 and is mounted on the second surface 22 of the second substrate 2 in the same manner as the mounting of the first semiconductor chip 20 on the second surface 12 of the first substrate 1 of the present embodiment by a second adhesive layer 37b having a structure similar to that of the first adhesive layer of the present embodiment.

A second conductive body 38 is placed in each of the windows 373 of the second adhesive layer 37b such that the second contact pads 302 on the second contact pad surface 301 of the second semiconductor chip 30 are connected electrically and respectively with the conductive bodies 38 in the windows 373 to establish electrical connection with the second circuit layout of the second substrate 2. A metal heat dissipating plate 304 is mounted on the surface 303 of the second semiconductor chip 30 opposite to the second contact pad surface 301 of the second semiconductor chip 30.

It should be noted that, the second semiconductor chip 30 is tested through second testing points (not shown) of the second substrate 2 at this stage so that replacement of the second semiconductor chip 30 can be conducted if the second semiconductor chip 30 is found to be defective. It should also be noted that, a portion of the second chip-receiving opening 36 not occupied by the second semiconductor chip 30 is filled with, for example, epoxy resin 39, to protect the second semiconductor chip 20 against moisture.

A third semiconductor chip 40 is mounted on the third substrate 3 in the same manner as the mounting of the second semiconductor chip on the second substrate of the first preferred embodiment by a third adhesive layer 47 having a structure similar to that of the second adhesive layer of the first preferred embodiment.

A third conductive body 48 is placed in each of the windows 473 of the third adhesive layer 47 such that the third contact pads 402 on the third contact pad surface 401 of the third semiconductor chip 40 are connected electrically and respectively with the third conductive bodies 48 in the windows 473 to establish electrical connection with the third circuit layout of the third substrate 3. A metal heat dissipating plate 404 is mounted on the surface 403 of the third semiconductor chip 40 opposite to the third contact pad surface 401 of the third semiconductor chip 40. The third contact pad surface 401 of the third semiconductor chip 40 has a contactless portion that abuts against the heat dissipating plate 304 on the second semiconductor chip 30.

In the present embodiment, on the second surface 32 of the third substrate 3, there is provided with a fourth semiconductor chip 50 and a fifth semiconductor chip 60. The fourth and fifth semiconductor chips 50, 60 are mounted respectively on the third substrate 3 in the same manner as the mounting of the first semiconductor chip 20 on the first substrate 1 of the present embodiment by a fourth adhesive layer 57 and a fifth adhesive layer 67 having structures similar to that of the first adhesive layer 27 of the present embodiment.

Encapsulation layers 49, 59, 69 are disposed on the second surface 42 of the fourth substrate 4 respectively around the third, fourth and fifth semiconductor chips 40, 50, 60 to protect the latter against external forces and moisture.

The third to fifth semiconductor chips 40 to 60 are tested through third testing points (not shown) of the third substrate 3 so that replacement of any of the semiconductor chips 40, 50, 60 can be conducted if any of semiconductor chips 40, 50, 60 is found to be defective.

Figure 25:
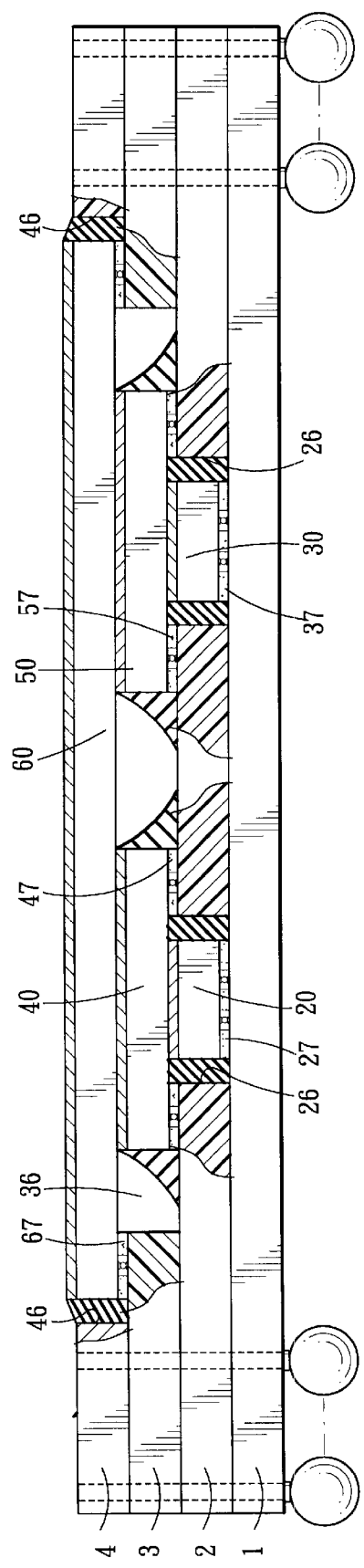
FIG. 25 is a schematic partly cross-sectional view of a multi-chip semiconductor module in accordance with a sixth preferred embodiment of the present invention.

FIG. 25 illustrates a multi-chip semiconductor module in accordance with a sixth preferred embodiment of the present invention. As shown, the chip-mounting member of the present embodiment includes first to fourth substrates 1 to 4. The structures of the first to fourth substrates 1 to 4 are generally similar to those of the first to fourth substrates of the first preferred embodiment, except that the second substrate 2 has two first chip-receiving openings 26 formed therein.

In the present embodiment, first and second semiconductor chips 20, 30 are disposed respectively in the first chip-receiving openings 26, and are mounted on the first substrate 1 by adhesive layers 27,37 having structures similar to that of the first adhesive layer of the first preferred embodiment. Third and fourth semiconductor chips 40, 50 are disposed in the second chip-receiving opening 36 of the third substrate 3, and are mounted on the second substrate 2 by adhesive layers 47,57 having structures similar to that of the second adhesive layer of the first preferred embodiment. A fifth semiconductor chip 60 is disposed in the third chip-receiving opening 46 of the fourth substrate 4, and is mounted on the third substrate 3 by an adhesive layer 67 having a structure similar to that of the second adhesive layer of the first preferred embodiment.

Figure 26:
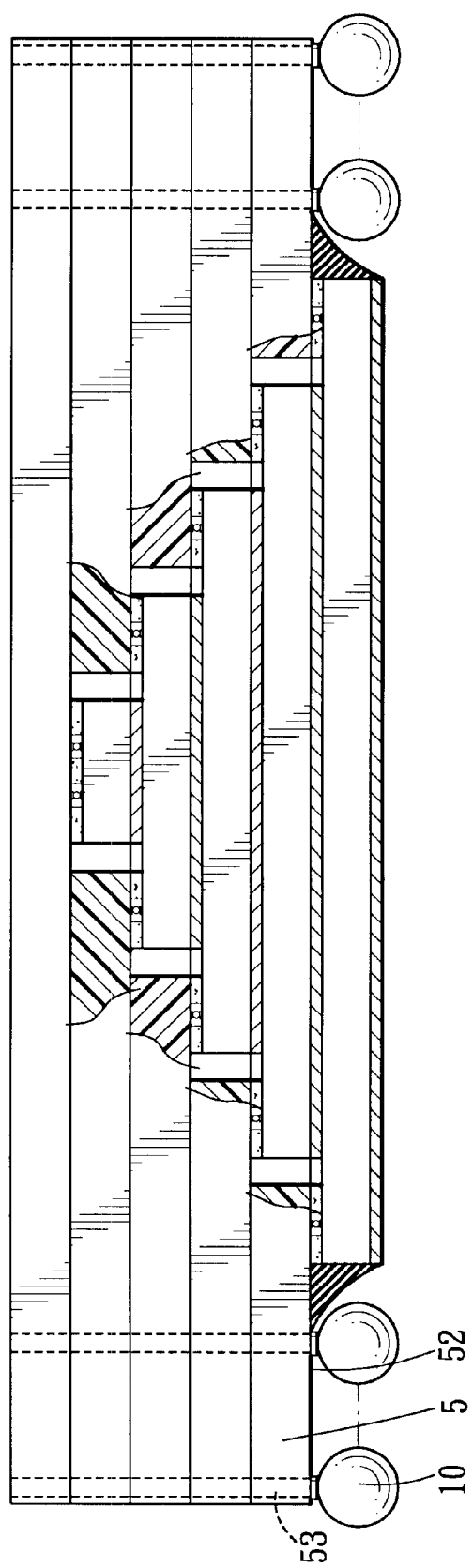
FIG. 26 is a schematic partly cross-sectional view of a multi-chip semiconductor module in accordance with a seventh preferred embodiment of the present invention.

FIG. 26 shows a multi-chip semiconductor module in accordance with a seventh preferred embodiment of the present invention. Unlike the first preferred embodiment, the solder balls 10 are mounted on the second surface 52 of the fifth substrate 5 at positions corresponding to the fifth conductive vias 53, and are connected electrically and respectively to the fifth conductive vias 53.

Figure 27:
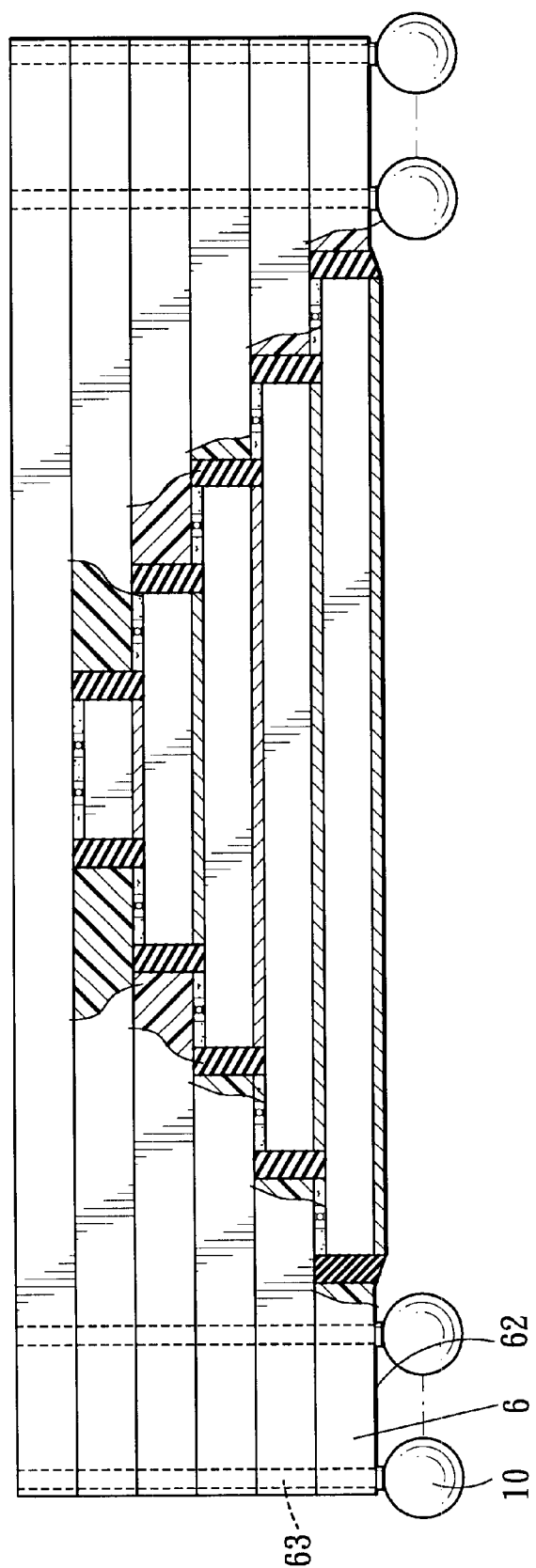
FIG. 27 is a schematic partly cross-sectional view of a multi-chip semiconductor module in accordance with an eighth preferred embodiment of the present invention.

FIG. 27 shows a multi-chip semiconductor module in accordance with an eighth preferred embodiment of the present invention. Unlike the second preferred embodiment, the solder balls 10 are mounted on the second surface 62 of the sixth substrate 6 at positions corresponding to the sixth conductive vias 63, and are connected electrically and respectively to the sixth conductive vias 63.

Figure 28:
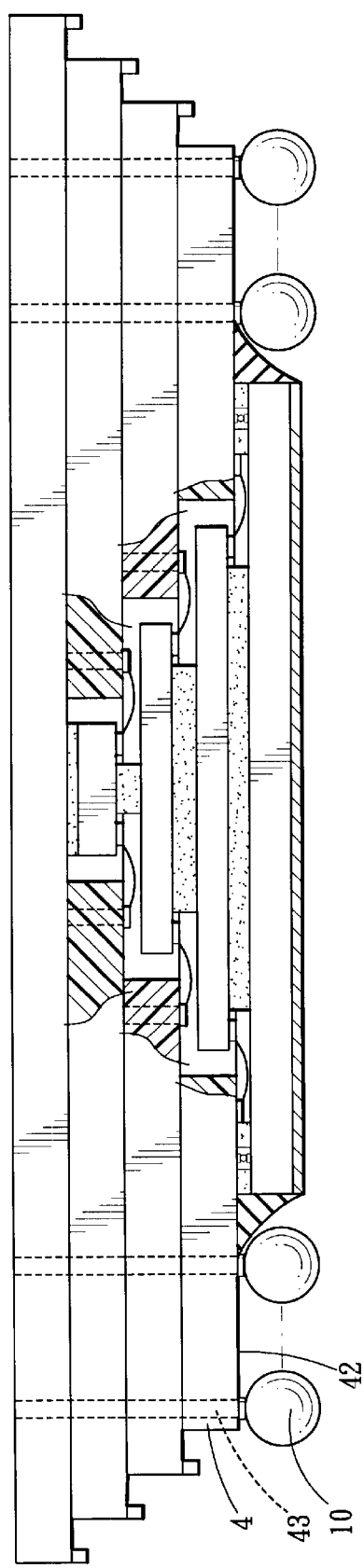
FIG. 28 is a schematic partly cross-sectional view of a multi-chip semiconductor module in accordance with a ninth preferred embodiment of the present invention.

FIG. 28 shows a multi-chip semiconductor module in accordance with a ninth preferred embodiment of the present invention. Unlike the fourth preferred embodiment, the solder balls 10 are mounted on the second surface 42 of the fourth substrate 4 at positions corresponding to the fourth conductive vias 43, and are connected electrically and respectively to the fourth conductive vias 43.

Figure 29:
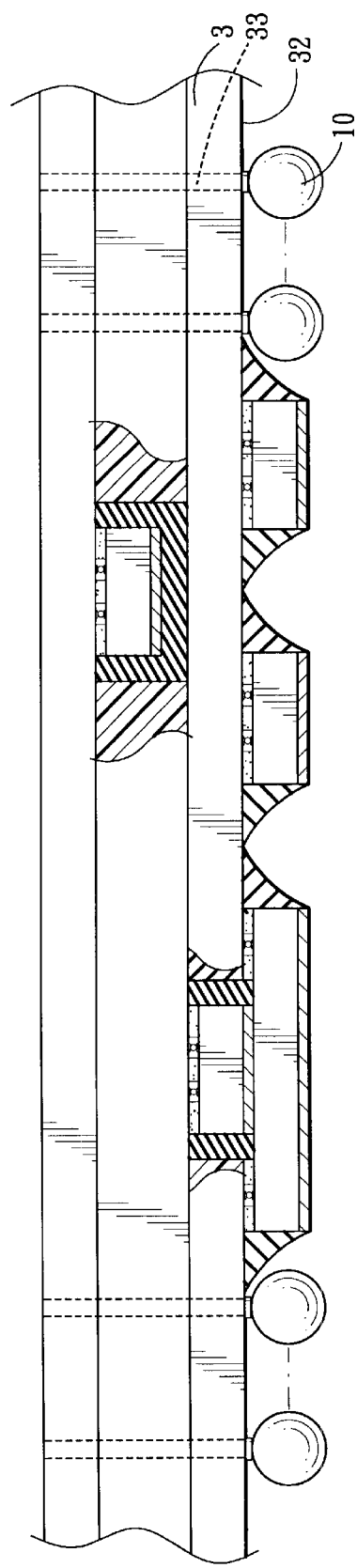
FIG. 29 is a schematic partly cross-sectional view of a portion of a multi-chip semiconductor module in accordance with a tenth preferred embodiment of the present invention.

FIG. 29 shows a multi-chip semiconductor module in accordance with a tenth preferred embodiment of the present invention. Unlike the fifth preferred embodiment, the solder balls 10 are mounted on the second surface 32 of the third substrate 3 at positions corresponding to the third conductive vias 33, and are connected electrically and respectively to the third conductive vias 33.

Figure 30:
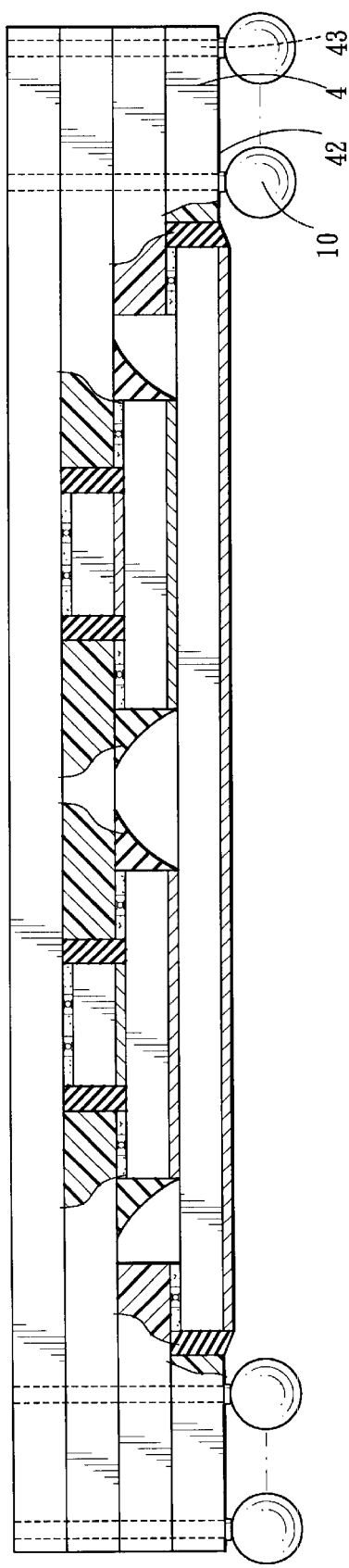
FIG. 30 is a schematic partly cross-sectional view of a multi-chip semiconductor module in accordance with an eleventh preferred embodiment of the present invention.

FIG. 30 shows a multi-chip semiconductor module in accordance with an eleventh preferred embodiment of the present invention. Unlike the sixth preferred embodiment, the solder balls 10 are mounted on the second surface 42 of the fourth substrate 4 at positions corresponding to the fourth conductive vias 43, and are connected electrically and respectively to the fourth conductive vias 43.

While the present invention has been disclosed with reference to the preferred embodiments described above, it is not intended to limit the present invention in any way. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process of manufacturing a multi-chip semiconductor module, comprising the steps of:

(a) providing a chip-mounting member including first and second substrates, said first substrate having opposite first and second surfaces, a plurality of first conductive vias that extend through said first and second surfaces, a first circuit layout patterned on said second surface and connected electrically to said first conductive vias, and a plurality of first testing points disposed on said second surface and connected electrically to said first circuit layout, said second substrate having opposite first and second surfaces, a plurality of second conductive vias that extend through said first and second surfaces of said second substrate, a second circuit layout patterned on said second surface of said second substrate and connected electrically to said second conductive vias, a plurality of second testing points disposed on said second surface of said second substrate and connected electrically to said second circuit layout, and a first chip-receiving opening formed therein;

(b) mounting a first contact pad surface of a first semiconductor chip on said second surface of said first substrate, and connecting electrically a plurality of first contact pads on said first contact pad surface to said first circuit layout;

(c) testing said first semiconductor chip through said first testing points of said first substrate so that replacement of said first semiconductor chip can be conducted if said first semiconductor chip is found to be defective;

(d) bonding said first surface of said second substrate on said second surface of said first substrate such that said first semiconductor chip is disposed in said first chip-receiving opening and such that said second circuit layout is connected electrically to said first circuit layout through said first and second conductive vias;

(e) mounting a second contact pad surface of a second semiconductor chip on said second surface of said second substrate, and connecting electrically a plurality of second contact pads on said second contact pad surface to said second circuit layout; and (f) testing said second semiconductor chip through said second testing points of said second substrate so that replacement of said second semiconductor chip can be conducted if said second semiconductor chip is found to be defective.

2. The process of claim 1, wherein said step (b) includes the sub-steps of:

providing an adhesive layer having opposite first and second adhesive surfaces and a plurality of windows that extend through said first and second adhesive surfaces;

adhering said first adhesive surface of said adhesive layer to said second surface of said first substrate such that said windows permit access to said first circuit layout from said second adhesive surface;

placing a conductive body in each of said windows; and attaching said first contact pad surface of said first semiconductor chip on said second adhesive surface of said adhesive layer, with said first contact pads connecting electrically and respectively with said conductive bodies in said windows to establish electrical connection with said first circuit layout.

3. The process of claim 1, wherein said step (e) includes the sub-steps of:

providing an adhesive layer having opposite first and second adhesive surfaces and a plurality of windows that extend through said first and second adhesive surfaces;

adhering said first adhesive surface of said adhesive layer to said second surface of said second substrate such that said windows permit access to said second circuit layout from said second adhesive surface;

placing a conductive body in each of said windows; and attaching said second contact pad surface of said second semiconductor chip on said second adhesive surface of said adhesive layer, with said second contact pads connecting electrically and respectively with said conductive bodies in said windows to establish electrical connection with said second circuit layout.

4. The process of claim 1, wherein in said step (e), said first and second semiconductor chips are disposed on a common vertical axis, and said second contact pads are disposed around said first chip-receiving opening when said second semiconductor chip is mounted on said second substrate.

5. The process of claim 4, wherein said chip-mounting member further includes a third substrate having opposite first and second surfaces, a plurality of third conductive vias that extend through said first and second surfaces of said third substrate, a third circuit layout patterned on said second surface of said third substrate and connected electrically to said third conductive vias, a plurality of third testing points disposed on said second surface of said third substrate and connected electrically to said third circuit layout, and a second chip-receiving opening larger than said first chip-receiving opening formed therein, said process further comprising the steps of:

(g) bonding said first surface of said third substrate on said second surface of said second substrate such that said second semiconductor chip is disposed in said second chip-receiving opening and such that said third circuit layout is connected electrically to said first and second circuit layouts through said first, second and third conductive vias;

(h) mounting a third contact pad surface of a third semiconductor chip on said second surface of said third substrate, and connecting electrically a plurality of third contact pads on said third contact pad surface to said third circuit layout; and (i) testing said third semiconductor chip through said third testing points of said third substrate so that replacement of said third semiconductor chip can be conducted if said third semiconductor chip is found to be defective.

6. The process of claim 5, wherein in said step (h), said third semiconductor chip is disposed on the common vertical axis, and said third contact pads are disposed around said second chip-receiving opening when said third semiconductor chip is mounted on said third substrate.

7. The process of claim 6, wherein in said step (d), said second substrate does not cover said first testing points when said second substrate is bonded on said first substrate, and in said step (g), said third substrate does not cover said second testing points when said third substrate is bonded to said second substrate.

8. The process of claim 7, further comprising the step of trimming said first, second and third substrates to form said first, second and third substrates with common vertical edges.

9. The process of claim 4, further comprising the step, prior to said step (d), of mounting a metal heat dissipating plate on one surface of said first semiconductor chip opposite to said first contact pad surface.

10. The process of claim 9, wherein in said step (e), said second contact pad surface of said second semiconductor chip has a contactless portion that abuts against said heat dissipating plate on said first semiconductor chip.

11. The process of claim 6, further comprising the step, prior to said step (h), of mounting a heat dissipating plate on one surface of said second semiconductor chip opposite to said second contact pad surface.

12. The process of claim 11, wherein in said step (h), said third contact pad surface of said third semiconductor chip has a contactless portion that abuts against said heat dissipating plate on said second semiconductor chip.

13. The process of claim 1, further comprising the step of mounting a plurality of solder balls on said first surface of said first substrate at positions corresponding to said first conductive vias such that said solder balls are connected electrically and respectively to said first conductive vias.

14. The process of claim 1, wherein said chip-mounting member further includes a third substrate having opposite first and second surfaces, a plurality of third conductive vias that extend through said first and second surfaces of said third substrate, a third circuit layout patterned on said second surface of said third substrate and connected electrically to said third conductive vias, a plurality of third testing points disposed on said second surface of said third substrate and connected electrically to said third circuit layout, and a second chip-receiving opening formed therein, said process further comprising the steps of:

(g) bonding said first surface of said third substrate on said second surface of said second substrate such that said second semiconductor chip is disposed in said second chip-receiving opening and such that said third circuit layout is connected electrically to said first and second circuit layouts through said first, second and third conductive vias;

(h) mounting a third contact pad surface of a third semiconductor chip on said second surface of said third substrate, and connecting electrically a plurality of third contact pads on said third contact pad surface to said third circuit layout; and (i) testing said third semiconductor chip through said third testing points of said third substrate so that replacement of said third semiconductor chip can be conducted if said third semiconductor chip is found to be defective.

15. The process of claim 14, wherein in said step (h), said second and third semiconductor chips are disposed on a common vertical axis, and said third contact pads are disposed around said second chip-receiving opening when said third semiconductor chip is mounted on said third substrate.

16. The process of claim 15, further comprising the step, prior to said step (h), of mounting a heat dissipating plate on one surface of said second semiconductor chip opposite to said second contact pad surface.

17. The process of claim 16, wherein in said step (h), said third contact pad surface of said third semiconductor chip has a contactless portion that abuts against said heat dissipating plate on said second semiconductor chip.

18. The process of claim 14, further comprising the step of mounting a plurality of solder balls on said second surface of said third substrate at positions corresponding to said third conductive vias such that said solder balls are connected electrically and respectively to said third conductive vias.

19. A process of manufacturing a multi-chip semiconductor module, comprising the steps of:

(a) providing a chip-mounting member including first and second substrates, said first substrate having opposite first and second surfaces, a plurality of first conductive vias that extend through said first and second surfaces, a first circuit layout patterned on said second surface and connected electrically to said first conductive vias, and a plurality of first testing points disposed on said second surface and connected electrically to said first circuit layout, said second substrate having opposite first and second surfaces, a plurality of second conductive vias that extend through said first and second surfaces of said second substrate, a second circuit layout patterned on said second surface of said second substrate and connected electrically to said second conductive vias, a plurality of second testing points disposed on said second surface of said second substrate and connected electrically to said second circuit layout, and a first chip-receiving opening formed therein;

said first surface of said second substrate being bonded on said second surface of said first substrate such that said second circuit layout is connected electrically to said first circuit layout through said first and second conductive vias, and such that said second substrate does not cover said first testing points;

(b) disposing a first semiconductor chip in said first chip-receiving opening, mounting a first contact pad surface of said first semiconductor chip on said second surface of said first substrate, and connecting electrically a plurality of first contact pads on said first contact pad surface to said first circuit layout;

(c) testing said first semiconductor chip through said first testing points of said first substrate so that replacement of said first semiconductor chip can be conducted if said first semiconductor chip is found to be defective;

(d) mounting a second contact pad surface of a second semiconductor chip on said second surface of said second substrate, and connecting electrically a plurality of second contact pads on said second contact pad surface to said second circuit layout; and (e) testing said second semiconductor chip through said second testing points of said second substrate so that replacement of said second semiconductor chip can be conducted if said second semiconductor chip is found to be defective.

20. The process of claim 19, wherein said step (b) includes the sub-steps of:

providing an adhesive layer having opposite first and second adhesive surfaces and a plurality of windows that extend through said first and second adhesive surfaces;

adhering said first adhesive surface of said adhesive layer to said second surface of said first substrate such that said windows permit access to said first circuit layout from said second adhesive surface;

placing a conductive body in each of said windows; and attaching said first contact pad surface of said first semiconductor chip on said second adhesive surface of said adhesive layer, with said first contact pads connecting electrically and respectively with said conductive bodies in said windows to establish electrical connection with said first circuit layout.

21. The process of claim 19, wherein said step (d) includes the sub-steps of:

providing an adhesive layer having opposite first and second adhesive surfaces and a plurality of windows that extend through said first and second adhesive surfaces;

adhering said first adhesive surface of said adhesive layer to said second surface of said second substrate such that said windows permit access to said second circuit layout from said second adhesive surface;

placing a conductive body in each of said windows; and attaching said second contact pad surface of said second semiconductor chip on said second adhesive surface of said adhesive layer, with said second contact pads connecting electrically and respectively with said conductive bodies in said windows to establish electrical connection with said second circuit layout.

22. The process of claim 19, wherein in said step (d), said second contact pads are disposed around said first chip-receiving opening when said second semiconductor chip is mounted on said second substrate.

23. The process of claim 22, wherein said chip-mounting member further includes a third substrate having opposite first and second surfaces, a plurality of third conductive vias that extend through said first and second surfaces of said third substrate, a third circuit layout patterned on said second surface of said third substrate and connected electrically to said third conductive vias, a plurality of third testing points disposed on said second surface of said third substrate and connected electrically to said third circuit layout, and a second chip-receiving opening larger than said first chip-receiving opening formed therein, said first surface of said third substrate being bonded on said second surface of said second substrate such that said third circuit layout is connected electrically to said first and second circuit layouts through said first, second and third conductive vias, such that said first and second chip-receiving openings are disposed on a common vertical axis, and such that said third substrate does not cover said second testing points; and wherein in said step (d), said second semiconductor chip is disposed in said second chip-receiving opening when said second semiconductor chip is mounted on said second substrate.

24. The process of claim 23, further comprising the steps of:

(f) mounting a third contact pad surface of a third semiconductor chip on said second surface of said third substrate, and connecting electrically a plurality of third contact pads on said third contact pad surface to said third circuit layout; and (g) testing said third semiconductor chip through said third testing points of said third substrate so that replacement of said third semiconductor chip can be conducted if said third semiconductor chip is found to be defective.

25. The process of claim 24, wherein in said step (f), said third contact pads are disposed around said second chip-receiving opening when said third semiconductor chip is mounted on said third substrate.

26. The process of claim 24, further comprising the step of trimming said first, second and third substrates to form said first, second and third substrates with common vertical edges.

27. The process of claim 22, further comprising the step, prior to said step (d), of mounting a metal heat dissipating plate on one surface of said first semiconductor chip opposite to said first contact pad surface.

28. The process of claim 27, wherein in said step (d), said second contact pad surface of said second semiconductor chip has a contactless portion that abuts against said heat dissipating plate on said first semiconductor chip.

29. The process of claim 24, further comprising the step, prior to said step (f), of mounting a heat dissipating plate on one surface of said second semiconductor chip opposite to said second contact pad surface.

30. The process of claim 29, wherein in said step (f), said third contact pad surface of said third semiconductor chip has a contactless portion that abuts against said heat dissipating plate on said second semiconductor chip.

31. The process of claim 19, further comprising the step of mounting a plurality of solder balls on said first surface of said first substrate at positions corresponding to said first conductive vias such that said solder balls are connected electrically and respectively to said first conductive vias.

32. A multi-chip semiconductor module, comprising:

a chip-mounting member including first and second substrates, said first substrate having opposite first and second surfaces, a plurality of first conductive vias that extend through said first and second surfaces, and a first circuit layout patterned on said second surface and connected electrically to said first conductive vias, said second substrate having opposite first and second surfaces, a plurality of second conductive vias that extend through said first and second surfaces of said second substrate, a second circuit layout patterned on said second surface of said second substrate and connected electrically to said second conductive vias, and a first chip-receiving opening formed therein, said first surface of said second substrate being bonded on said second surface of said first substrate such that said second circuit layout is connected electrically to said first circuit layout through said first and second conductive vias;

a first semiconductor chip disposed in said first chip-receiving opening and having a first contact pad surface mounted on said second surface of said first substrate, said first contact pad surface being formed with a plurality of first contact pads;

first conductor means for connecting electrically said first contact pads to said first circuit layout;

a second semiconductor chip having a second contact pad surface mounted on said second surface of said second substrate, said second contact pad surface being formed with a plurality of second contact pads; and second conductor means for connecting electrically said second contact pads to said second circuit layout.

33. The multi-chip semiconductor module of claim 32, further comprising an adhesive layer having opposite first and second adhesive surfaces and a plurality of windows that extend through said first and second adhesive surfaces, said first adhesive surface of said adhesive layer being adhered to said second surface of said first substrate such that said windows permit access to said first circuit layout from said second adhesive surface, said first conductor means including a plurality of conductive bodies placed respectively in said windows, said first contact pad surface of said first semiconductor chip being attached on said second adhesive surface of said adhesive layer, said first contact pads connecting electrically and respectively with said conductive bodies in said windows to establish electrical connection with said first circuit layout.

34. The multi-chip semiconductor module of claim 32, further comprising an adhesive layer having opposite first and second adhesive surfaces and a plurality of windows that extend through said first and second adhesive surfaces, said first adhesive surface of said adhesive layer being adhered to said second surface of said second substrate such that said windows permit access to said second circuit layout from said second adhesive surface, said second conductor means including a plurality of conductive bodies placed respectively in said windows, said second contact pad surface of said second semiconductor chip being attached on said second adhesive surface of said adhesive layer, said second contact pads connecting electrically and respectively with said conductive bodies in said windows to establish electrical connection with said second circuit layout.

35. The multi-chip semiconductor module of claim 32, wherein said first and second semiconductor chips are disposed on a common vertical axis, and said second contact pads are disposed around said first chip-receiving opening.

36. The multi-chip semiconductor module of claim 35, wherein said chip-mounting member further includes a third substrate having opposite first and second surfaces, a plurality of third conductive vias that extend through said first and second surfaces of said third substrate, a third circuit layout patterned on said second surface of said third substrate and connected electrically to said third conductive vias, and a second chip-receiving opening larger than said first chip-receiving opening formed therein, said first surface of said third substrate being bonded on said second surface of said second substrate such that said second semiconductor chip is disposed in said second chip-receiving opening and such that said third circuit layout is connected electrically to said first and second circuit layouts through said first, second and third conductive vias, said multi-chip semiconductor module further comprising:

a third semiconductor chip having a third contact pad surface on which a plurality of third contact pads are disposed, said third contact pad surface of said third semiconductor chip being mounted on said second surface of said third substrate, said third contact pads being connected electrically to said third circuit layout.

37. The multi-chip semiconductor module of claim 35, further comprising a metal heat dissipating plate mounted on one surface of said first semiconductor chip opposite to said first contact pad surface.

38. The multi-chip semiconductor module of claim 37, wherein said second contact pad surface of said second semiconductor chip has a contactless portion that abuts against said heat dissipating plate on said first semiconductor chip.

39. The multi-chip semiconductor module of claim 36, wherein said third semiconductor chip is disposed on said common vertical axis, and said third contact pads are disposed around said second chip-receiving opening.

40. The multi-chip semiconductor module of claim 39, further comprising a metal heat dissipating plate mounted on one surface of said second semiconductor chip opposite to said second contact pad surface.

41. The multi-chip semiconductor module of claim 40, wherein said third contact pad surface of said third semiconductor chip has a contactless portion that abuts against said heat dissipating plate on said second semiconductor chip.

42. The multi-chip semiconductor module of claim 32, further comprising a plurality of solder balls mounted on said first surface of said first substrate at positions corresponding to said first conductive vias and connected electrically and respectively to said first conductive vias.

43. The multi-chip semiconductor module of claim 32, wherein said chip-mounting member further includes a third substrate having opposite first and second surfaces, a plurality of third conductive vias that extend through said first and second surfaces of said third substrate, a third circuit layout patterned on said second surface of said third substrate and connected electrically to said third conductive vias, and a second chip-receiving opening formed therein, said first surface of said third substrate being bonded on said second surface of said second substrate such that said second semiconductor chip is disposed in said second chip-receiving opening and such that said third circuit layout is connected electrically to said first and second circuit layouts through said first, second and third conductive vias, said multi-chip semiconductor module further comprising:

a third semiconductor chip having a third contact pad surface on which a plurality of third contact pads are disposed, said third contact pad surface of said third semiconductor chip being mounted on said second surface of said third substrate, said third contact pads being connected electrically to said third circuit layout.

44. The multi-chip semiconductor module of claim 43, further comprising a plurality of solder balls mounted on said second surface of said third substrate at positions corresponding to said third conductive vias and connected electrically and respectively to said third conductive vias.

45. A process of manufacturing a multi-chip semiconductor module, comprising the steps of:

(a) providing a chip-mounting member including first, second and third substrates, said first substrate having opposite first and second surfaces, and a plurality of first conductive vias that extend through said first and second surfaces, said second substrate having opposite first and second surfaces, a plurality of second conductive vias that extend through said first and second surfaces of said second substrate, a first circuit layout patterned on said second surface of said second substrate and connected electrically to said second conductive vias, a plurality of first testing points disposed on said second surface of said second substrate and connected electrically to said first circuit layout, and a first chip-receiving opening formed therein, said third substrate having opposite first and second surfaces, a plurality of third conductive vias that extend through said first and second surfaces of said third substrate, a second circuit layout patterned on said second surface of said third substrate and connected electrically to said third conductive vias, a plurality of second testing-points disposed on said second surface of said third substrate and connected electrically to said second circuit layout, and a second chip-receiving opening larger than said first chip-receiving opening formed therein;

(b) bonding said first surface of said second substrate on said second surface of said first substrate such that said first circuit layout is connected electrically to said first conductive vias through said second conductive vias;

(c) disposing a first semiconductor chip in said first chip-receiving opening, mounting said first semiconductor chip on said second surface of said first substrate, and wire-bonding a plurality of first contact pads on one side of said first semiconductor chip to said first circuit layout;

(d) testing said first semiconductor chip through said first testing points so that replacement of said first semiconductor chip can be conducted if said first semiconductor chip is found to be defective;

(e) bonding said first surface of said third substrate on said second surface of said second substrate such that said second circuit layout is connected electrically to said first circuit layout through said second and third conductive vias, and such that said first and second chip-receiving openings are disposed on a common vertical axis;

(f) disposing a second semiconductor chip in said second chip-receiving opening, mounting said second semiconductor chip on said one side of said first semiconductor chip through a first adhesive layer such that said second semiconductor chip is spaced apart from said second surface of said second substrate along the vertical axis, and wire-bonding a plurality of second contact pads on one side of said second semiconductor chip to said second circuit layout; and (g) testing said second semiconductor chip through said second testing points so that replacement of said second semiconductor chip can be conducted if said second semiconductor chip is found to be defective.

46. The process of claim 45, wherein said chip-mounting member further includes a fourth substrate having opposite first and second surfaces, a plurality of fourth conductive vias that extend through said first and second surfaces of said fourth substrate, a third circuit layout patterned on said second surface of said fourth substrate and connected electrically to said fourth conductive vias, a plurality of third testing points disposed on said second surface of said fourth substrate and connected electrically to said third circuit layout, and a third chip-receiving opening larger than said second chip-receiving opening formed therein, said process further comprising the steps of:

(h) bonding said first surface of said fourth substrate on said second surface of said third substrate such that said third circuit layout is connected electrically to said second circuit layout through said third and fourth conductive vias, and such that said third chip-receiving opening is disposed on the common vertical axis;

(i) disposing a third semiconductor chip in said third chip-receiving opening, mounting said third semiconductor chip on said one side of said second semiconductor chip through a second adhesive layer such that said third semiconductor chip is spaced apart from said second surface of said third substrate along the vertical axis, and wire-bonding a plurality of third contact pads on one side of said third semiconductor chip to said third circuit layout; and testing said third semiconductor chip through said third testing points so that replacement of said third semiconductor chip can be conducted if said third semiconductor chip is found to be defective.

47. The process of claim 46, further comprising the step of mounting a fourth semiconductor chip on said second surface of said fourth substrate, and connecting electrically a plurality of fourth contact pads on one side of said fourth semiconductor chip to said third circuit layout.

48. The process of claim 46, wherein in said step (e), said third substrate does not cover said first testing points when said third substrate is bonded to said second substrate, and in said step (h), said fourth substrate does not cover said second testing points when said third substrate is bonded to said third substrate.

49. The process of claim 48, further comprising the step of trimming said first, second, third and fourth substrates to form said first, second, third and fourth substrates with common vertical edges.

50. The process of claim 47, further comprising the step of mounting a metal heat dissipating plate on one surface of said fourth semiconductor chip opposite to said second surface of said fourth substrate.

51. The process of claim 45, further comprising the step of mounting a plurality of solder balls on said first surface of said first substrate at positions corresponding to said first conductive vias such that said solder balls are connected electrically and respectively to said first conductive vias.

52. The process of claim 46, further comprising the step of mounting a plurality of solder balls on said second surface of said fourth substrate at positions corresponding to said fourth conductive vias such that said solder balls are connected electrically and respectively to said fourth conductive vias.

53. A process of manufacturing a multi-chip semiconductor module, comprising the steps of:

(a) providing a chip-mounting member including first, second and third substrates, said first substrate having opposite first and second surfaces, and a plurality of first conductive vias that extend through said first and second surfaces, said second substrate having opposite first and second surfaces, a plurality of second conductive vias that extend through said first and second surfaces of said second substrate, a first circuit layout patterned on said second surface of said second substrate and connected electrically to said second conductive vias, a plurality of first testing points disposed on said second surface of said second substrate and connected electrically to said first circuit layout, and a first chip-receiving opening formed therein, said first surface of said second substrate being bonded on said second surface of said first substrate such that said first circuit layout is connected electrically to said first conductive vias through said second conductive vias, said third substrate having opposite first and second surfaces, a plurality of third conductive vias that extend through said first and second surfaces of said third substrate, a second circuit layout patterned on said second surface of said third substrate and connected electrically to said third conductive vias, a plurality of second testing points disposed on said second surface of said third substrate and connected electrically to said second circuit layout, and a second chip-receiving opening larger than said first chip-receiving opening formed therein, said first surface of said third substrate being bonded on said second surface of said second substrate such that said second circuit layout is connected electrically to said first circuit layout through said second and third conductive vias, such that said first and second chip-receiving openings are disposed on a common vertical axis, and such that said third substrate does not cover said first testing points, (b) disposing a first semiconductor chip in said first chip-receiving opening, mounting said first semiconductor chip on said second surface of said first substrate, and wire-bonding a plurality of first contact pads on one side of said first semiconductor chip to said first circuit layout;

(c) testing said first semiconductor chip through said first testing points so that replacement of said first semiconductor chip can be conducted if said first semiconductor chip is found to be defective;

(d) disposing a second semiconductor chip in said second chip-receiving opening, mounting said second semiconductor chip on said one side of said first semiconductor chip through a first adhesive layer such that said second semiconductor chip is spaced apart from said second surface of said second substrate along the vertical axis, and wire-bonding a plurality of second contact pads on one side of said second semiconductor chip to said second circuit layout; and (e) testing said second semiconductor chip through said second testing points so that replacement of said second semiconductor chip can be conducted if said second semiconductor chip is found to be defective.

54. The process of claim 53, wherein said chip-mounting member further includes a fourth substrate having opposite first and second surfaces, a plurality of fourth conductive vias that extend through said first and second surfaces of said fourth substrate, a third circuit layout patterned on said second surface of said fourth substrate and connected electrically to said fourth conductive vias, a plurality of third testing points disposed on said second surface of said fourth substrate and connected electrically to said third circuit layout, and a third chip-receiving opening larger than said second chip-receiving opening formed therein, said first surface of said fourth substrate being bonded on said second surface of said third substrate such that said third circuit layout is connected electrically to said second circuit layout through said third and fourth third conductive vias, such that said third chip-receiving opening is disposed on the common vertical axis, and such that said fourth substrate does not cover said second testing points, said process further comprising the steps of:

(f) disposing a third semiconductor chip in said third chip-receiving opening, mounting said third semiconductor chip on said one side of said second semiconductor chip through a second adhesive layer such that said third semiconductor chip is spaced apart from said second surface of said third substrate along the vertical axis, and wire-bonding a plurality of third contact pads on one side of said third semiconductor chip to said third circuit layout; and (g) testing said third semiconductor chip through said third testing points so that replacement of said third semiconductor chip can be conducted if said third semiconductor chip is found to be defective.

55. The process of claim 54, further comprising the step of mounting a fourth semiconductor chip on said second surface of said fourth substrate, and connecting electrically a plurality of fourth contact pads on one side of said fourth semiconductor chip to said third circuit layout.

56. The process of claim 54, further comprising the step of trimming said first, second, third and fourth substrates to form said first, second, third and fourth substrates with common vertical edges.

57. The process of claim 55, further comprising the step of mounting a metal heat dissipating plate on one surface of said fourth semiconductor chip opposite to said second surface of said fourth substrate.

58. The process of claim 53, further comprising the step of mounting a plurality of solder balls on said first surface of said first substrate at positions corresponding to said first conductive vias such that said solder balls are connected electrically and respectively to said first conductive vias.

59. The process of claim 54, further comprising the step of mounting a plurality of solder balls on said second surface of said fourth substrate at positions corresponding to said fourth conductive vias such that said solder balls are connected electrically and respectively to said fourth conductive vias.

60. A multi-chip semiconductor module, comprising:
   a chip-mounting member including first, second and third substrates,
      said first substrate having opposite first and second surfaces, and a plurality of first conductive vias that extend through said first and second surfaces,
      said second substrate having opposite first and second surfaces, a plurality of second conductive vias that extend through said first and second surfaces of said second substrate, a first circuit layout patterned on said second surface of said second substrate and connected electrically to said second conductive vias, and a first chip-receiving opening formed therein, said first surface of said second substrate being bonded on said second surface of said first substrate such that said first circuit layout is connected electrically to said first conductive vias through said second conductive vias,
      said third substrate having opposite first and second surfaces, a plurality of third conductive vias that extend through said first and second surfaces of said third substrate, a second circuit layout patterned on said second surface of said third substrate and connected electrically to said third conductive vias, and a second chip-receiving opening larger than said first chip-receiving opening formed therein, said first surface of said third substrate being bonded on said second surface of said second substrate such that said second circuit layout is connected electrically to said first circuit layout through said second and third conductive vias, and such that said first and second chip-receiving openings are disposed on a common vertical axis;
   a first semiconductor chip having one side provided with a plurality of first contact pads, said first semiconductor chip being disposed in said first chip-receiving opening and being mounted on said second surface of said first substrate, said first contact pads being wire-bonded to said first circuit layout;
   a second semiconductor chip having one side provided with a plurality of second contact pads, said second semiconductor chip being disposed in said second chip-receiving opening, said second contact pads being wire-bonded to said second circuit layout; and
   a first adhesive layer for mounting said second semiconductor chip on said one side of said first semiconductor chip such that said second semiconductor chip is spaced apart from said second surface of said second substrate along the vertical axis.

61. The multi-chip semiconductor module of claim 60, wherein said chip-mounting member further includes a fourth substrate having opposite first and second surfaces, a plurality of fourth conductive vias that extend through said first and second surfaces of said fourth substrate, a third circuit layout patterned on said second surface of said fourth substrate and connected electrically to said fourth conductive vias, and a third chip-receiving opening larger than said second chip-receiving opening formed therein, said first surface of said fourth substrate being bonded on said second surface of said third substrate such that said third circuit layout is connected electrically to said second circuit layout through said third and fourth conductive vias, and such that said third chip-receiving opening is disposed on the common vertical axis, said multi-chip semiconductor module further comprising:
   a third semiconductor chip having one side provided with a plurality of third contact pads, said third semiconductor chip being disposed in said third chip-receiving opening, said third contact pads being wire-bonded to said third circuit layout; and
   a second adhesive layer for mounting said third semiconductor chip on said one side of said second semiconductor chip such that said third semiconductor chip is spaced apart from said second surface of said third substrate along the vertical axis.

62. The multi-chip semiconductor module of claim 61, further comprising a fourth semiconductor chip mounted on said second surface of said fourth substrate, and having one side formed with a plurality of fourth contact pads that are connected electrically to said third circuit layout.

63. The multi-chip semiconductor module of claim 62, further comprising a metal heat dissipating plate mounted on one surface of said fourth semiconductor chip opposite to said second surface of said fourth substrate.

64. The multi-chip semiconductor module of claim 60, further comprising a plurality of solder balls mounted on said first surface of said first substrate at positions corresponding to said first conductive vias and connected electrically and respectively to said first conductive vias.

65. The multi-chip semiconductor module of claim 61, further comprising a plurality of solder balls mounted on said second surface of said fourth substrate at positions corresponding to said fourth conductive vias and connected electrically and respectively to said fourth conductive vias.

* * * * *